United States Patent
Namekata et al.

(10) Patent No.: US 11,725,104 B2
(45) Date of Patent: Aug. 15, 2023

(54) RESIN COMPOSITION

(71) Applicant: AJINOMOTO CO., INC., Tokyo (JP)

(72) Inventors: Nana Namekata, Kawasaki (JP); Yoshio Nishimura, Kawasaki (JP)

(73) Assignee: AJINOMOTO CO., INC., Tokyo (JP)

(*) Notice: Subject to any disclaimer, the term of this patent is extended or adjusted under 35 U.S.C. 154(b) by 0 days.

(21) Appl. No.: 16/916,987

(22) Filed: Jun. 30, 2020

(65) Prior Publication Data

US 2021/0002475 A1    Jan. 7, 2021

(30) Foreign Application Priority Data

Jul. 2, 2019  (JP) ................................ 2019-123978

(51) Int. Cl.

| | | |
|---|---|---|
| C08L 63/00 | (2006.01) | |
| B32B 27/08 | (2006.01) | |
| B32B 27/32 | (2006.01) | |
| B32B 27/36 | (2006.01) | |
| B32B 15/14 | (2006.01) | |
| B32B 15/20 | (2006.01) | |
| H05K 1/03 | (2006.01) | |
| B32B 27/38 | (2006.01) | |
| B32B 27/26 | (2006.01) | |
| B32B 27/20 | (2006.01) | |

(52) U.S. Cl.
CPC .............. *C08L 63/00* (2013.01); *B32B 15/14* (2013.01); *B32B 15/20* (2013.01); *B32B 27/08* (2013.01); *B32B 27/20* (2013.01); *B32B 27/26* (2013.01); *B32B 27/32* (2013.01); *B32B 27/36* (2013.01); *B32B 27/38* (2013.01); *H05K 1/0373* (2013.01); *B32B 2262/101* (2013.01); *B32B 2457/08* (2013.01); *C08L 2203/20* (2013.01); *H05K 2201/0209* (2013.01)

(58) Field of Classification Search
CPC ................ C08L 63/00; C08L 2203/20; C08L 2205/025; C08L 2205/035; C08L 21/00; C08L 9/00; C08L 15/00; B32B 27/20; B32B 27/38; B32B 27/26; B32B 27/08; B32B 27/32; B32B 27/36; B32B 15/20; B32B 15/14; B32B 2457/08; B32B 2262/101; B32B 27/18; B32B 27/06; H05K 1/0373; H05K 2201/0209; H05K 2201/0133; H05K 2201/0212; H05K 1/0353; C08J 7/04; C08J 2367/02; C08J 2463/00; C08J 2463/02; C08K 2201/006; C08K 3/013; C08K 3/36; C08G 59/42

See application file for complete search history.

(56) References Cited

U.S. PATENT DOCUMENTS

| | | | |
|---|---|---|---|
| 10,645,804 B2 | 5/2020 | Matsuura et al. | |
| 2011/0223383 A1* | 9/2011 | Goto | C08K 9/06 428/141 |
| 2014/0087152 A1* | 3/2014 | Nakamura | H05K 3/381 523/456 |
| 2014/0199533 A1* | 7/2014 | Matsuura | H05K 3/4673 428/215 |
| 2015/0056434 A1* | 2/2015 | Kawasaki | H05K 3/4611 428/221 |
| 2018/0291242 A1* | 10/2018 | Ml | C09J 133/10 |

FOREIGN PATENT DOCUMENTS

| | | | |
|---|---|---|---|
| JP | 2013-21025 A | 1/2013 | |
| JP | 2014-120687 A | 6/2014 | |
| JP | 2016-27097 A | 2/2016 | |
| JP | 2017-179058 A | 10/2017 | |
| JP | 2017-179279 A | 10/2017 | |
| JP | 2018058959 A * | 4/2018 | ............... C08K 3/22 |
| JP | 2019-016811 A | 1/2019 | |
| JP | 2019-35059 A | 3/2019 | |
| JP | 2019-38969 A | 3/2019 | |
| WO | WO 2008/153208 A1 | 12/2008 | |
| WO | WO 2010/035451 A1 | 4/2010 | |
| WO | WO-2018164259 A1 * | 9/2018 | ............. B32B 15/08 |

OTHER PUBLICATIONS

Machine translation of JP 2018058959 A, https://patentscope.wipo.int/search/en/detail.jsf?docId=JP274455231&_cid=P10-L2TDNW-48839-1 (Year: 2018).*

Machine Translation of WO 2018/7164259; Patent Translate (Year: 2018).*

Office Acton dated Aug. 9, 2022 in the corresponding Japanese patent application No. 2019-123978 (with English machine tranlsation).

Japanese Decision of Refusal dated Nov. 15, 2022 in Japanese Patent Application No. 2019-123978 (with English machine translation), 10 pages.

* cited by examiner

*Primary Examiner* — Callie E Shosho
*Assistant Examiner* — Bethany M Miller
(74) *Attorney, Agent, or Firm* — Oblon, McClelland, Maier & Neustadt, L.L.P.

(57) ABSTRACT

A resin composition includes (A) an epoxy resin, (B) an inorganic filler, and (C) a particulate or a non-particulate elastomer, in which a specific surface area of the (B) component is 10 m²/g or more, a content of the (C) component is 35% by mass or less, and an average particle diameter of the (C) component is 0.8 μm or less.

12 Claims, No Drawings

RESIN COMPOSITION

BACKGROUND OF THE INVENTION

1. Field of the Invention

The present invention relates to a resin composition including an epoxy resin. The present invention further relates to a cured product, a sheet-like laminate material, a resin sheet, a printed wiring board, and a semiconductor device, all being obtained by using this resin composition.

2. Description of the Related Art

A build-up method in which an insulating layer and a conductive layer are alternately piled up has been known as a manufacturing technology of a printed wiring board. In the manufacturing method using the build-up method, in general, an insulating layer is formed by curing a resin composition.

The printed wiring board is exposed to various environments such as high temperature, and low temperature; thus, if a linear thermal expansion coefficient of a cured product material to be used in the insulating layer is high, the insulating layer repeats expansion and shrinkage thereby causing a crack due to a strain caused thereby. A known method to lower the linear thermal expansion coefficient thereof is to blend a cured product material with a large amount of an inorganic filler (Japanese Patent Application Laid-open No. 2016-27097). However, if the cured product material is blended with a large amount of the inorganic filler, an elastic modulus thereof becomes so high that to suppress a warp becomes difficult.

When a cured product material is made to include an inorganic filler, it is found that an adhesion property between a conductive layer such as copper foil and an insulating layer deteriorates. In recent years, a smaller semiconductor chip package is wanted, so that a superior adhesion property is wanted.

In addition, in recent years, insulation reliability of the insulating layer and formability of a via hole having a small diameter are required to be further improved.

On the other hand, so far, an epoxy resin composition blended with an elastomer has been known (Japanese Patent Application Laid-open No. 2019-38969 and International. Publication No. 2008/153208).

Patent Document 1

Japanese Patent Application Laid-open No. 2016-27097

Patent Document 2

Japanese Patent Application Laid-open No. 2019-38969

Patent Document 3

International Publication No. 2008/153208

SUMMARY OF THE INVENTION

An object of the present invention is to provide, among others, a resin composition that can suppress a warp in a cured product thereof and can accomplish superior insulation reliability, adhesion property, and formability of a via hole having a small diameter.

The inventors of the present invention carried out an extensive investigation to achieve the object of the present invention; and as a result, when a resin composition including (A) an epoxy resin, (B) an inorganic filler, and (C) a particulate or a non-particulate elastomer, in which a specific surface area of the (B) component was 10 $m^2$/g or more, a content of the (C) component was 35% by mass or less (component ratio except for the (B) component), and an average particle diameter of the (C) component was 0.8 μm or less was used, it was found that a warp in a cured product thereof could be suppressed, and in addition, superior insulation reliability, adhesion property, and formability of a via hole having a small diameter could be obtained. The present invention was accomplished on the basis of this finding.

[1] A resin composition comprising: (A) an epoxy resin, (B) an inorganic filler, and (C) a particulate or a non-particulate elastomer, wherein a specific surface area of the (B) component is 10 $m^2$/g or more, a content of the (C) component is 35% by mass or less on the basis of 100% by mass of non-volatile components except for the (B) component in the resin composition, and an average particle diameter of the (C) component is 0.8 μm or less when the (C) component is particulate.

[2] The resin composition according to the above [1], wherein a specific surface area of the (B) component is 20 $m^2$/g or more.

[3] The resin composition according to the above [1] or [2], wherein the (B) component is silica.

[4] The resin composition according to any of the above [1] to [3], wherein a content of the (C) component is 25% by mass or less on the basis of 100% by mass of non-volatile components except for the (B) component in the resin composition.

[5] The resin composition according to any of the above [1] to [4], wherein a content of the (C) component is 1% by mass or more on the basis of 100% by mass of non-volatile components except for the (B) component in the resin composition.

[6] The resin composition according to any of the above [1] to [5], wherein the (C) component is a particulate elastomer, and the particulate elastomer includes at least one selected from the group consisting of styrene-butadiene rubber particle, isoprene rubber particle, butadiene rubber particle, chloroprene rubber particle, acrylonitrile-butadiene rubber particle, butyl rubber particle, ethylene-propylene rubber particle, urethane rubber particle, silicone rubber particle, chlorosulfonated polyethylene rubber particle, chlorinated polyethylene rubber particle, acryl rubber particle, epichlorohydrin rubber particle, polysulfide rubber particle, and fluorine-containing rubber particle.

[7] The resin composition according to any of the above [1] to [5], wherein the (C) component is a non-particulate elastomer, and the non-particulate elastomer includes in its molecule at least one structure selected from the group consisting of a polybutadiene structure, a polysiloxane structure, a poly(meth)acrylate structure, a polyalkylene structure, a polyalkylene oxy structure, a polyisoprene structure, a polyisobutylene structure, and a polycarbonate structure.

[8] The resin composition according to the above [7], wherein the non-particulate elastomer includes a polybutadiene resin.

[9] The resin composition according to the above [8], wherein the non-particulate elastomer includes at least one resin selected from the group consisting of a polybutadiene resin having a phenolic hydroxy group and a polybutadiene resin having an epoxy group.

[10] The resin composition according to any of the above [1] to [9], further comprising (D) a curing agent.

[11] The resin composition according to the above [10], wherein the (D) component comprises an active ester type curing agent.

[12] The resin composition according to the above [10] or [11], wherein a content of the (D) component is 30% by mass or more on the basis of 100% by mass of non-volatile components except for the (B) component in the resin composition.

[13] A cured product of the resin composition according to any of the above [1] to [12].

[14] A sheet-like laminate material comprising the resin composition according to any of the above [1] to [12].

[15] A resin sheet comprising: a support and a resin composition layer formed on the support and formed of the resin composition according to any of the above [1] to [12].

[16] A printed wiring board comprising an insulating layer formed of a cured product of the resin composition according to any of the above [1] to [12].

[17] A semiconductor device comprising the printed wiring board according to the above [16].

With a resin composition according to the present invention, a warp of a cured product thereof can be suppressed, and superior insulation reliability, adhesion property, and formability of a via hole having a small diameter can be accomplished.

DETAILED DESCRIPTION OF THE PREFERRED EMBODIMENTS

Hereinafter, the present invention will be explained in detail on the basis of the preferred embodiments thereof. The present invention is, however, not limited to the embodiments nor to the exemplified materials described below; therefore, the present invention can be carried out with an arbitrary modification thereof so far as the modified embodiments and materials are not outside the claims or the equivalents thereof.

Resin Composition

The resin composition according to the present invention includes (A) an epoxy resin, (B) an inorganic filler, and (C) a particulate or a non-particulate elastomer, in which a specific surface area of the (B) component is 10 $m^2/g$ or more, a content of the (C) component is 35% by mass or less (component ratio except for the (B) component), and an average particle diameter of the (C) component is 0.8 μm or less. When the resin composition as described above is used, a warp in a cured product thereof can be suppressed, and in addition, superior insulation reliability, adhesion property, and formability of a via hole having a small diameter can be accomplished.

In addition to (A) the epoxy resin, (B) the inorganic filler, (C) the particulate or the non-particulate elastomer, the resin composition according to the present invention may further include arbitrary components. Illustrative examples of the arbitrary component include (D) a curing agent, (E) a curing accelerator, (F) a flame retardant, (G) a thermoplastic resin, (H) other additives, and (I) an organic solvent. Hereinafter, these components included in the resin composition will be explained in detail.

(A) Epoxy Resin

The resin composition according to the present invention includes (A) an epoxy resin. (A) The epoxy resin means a resin having an epoxy group. Here, (A) the epoxy resin does not include those belonging to the (C) component.

Illustrative examples of the (A) epoxy resin include a bixylenol epoxy resin, a bisphenol A epoxy resin, a bisphenol F epoxy resin, a bisphenol S epoxy resin, a bisphenol AF epoxy resin, a dicyclopentadiene epoxy resin, a trisphenol epoxy resin, a naphthol novolak epoxy resin, a phenol novolak epoxy resin, a tert-butyl-catechol epoxy resin, a naphthalene epoxy resin, a naphthol epoxy resin, an anthracene epoxy resin, a glycidyl amine epoxy resin, a glycidyl ester epoxy resin, a cresol novolak epoxy resin, a biphenyl epoxy resin, an alicyclic epoxy resin, a heterocyclic epoxy resin, an epoxy resin having a Spiro ring, a cyclohexane epoxy resin, a cyclohexane dimethanol epoxy resin, a naphthylene ether epoxy resin, a trimethylol epoxy resin, and a tetraphenylethane epoxy resin. These epoxy resins may be used singly or as a combination of two or more of them.

It is preferable that (A) the epoxy resin have two or more epoxy groups in one molecule thereof. It is preferable that at least 50% by mass or more on the basis of 100% by mass of non-volatile components in the epoxy resin are the epoxy resin having two or more epoxy groups in one molecule thereof. In particular, it is preferable that the resin composition include a combination of an epoxy resin that is in the state of liquid at 20° C. (hereinafter, this is also called "liquid epoxy resin") and an epoxy resin that is in the state of solid at 20° C. (hereinafter, this is also called "solid epoxy resin"). As the liquid epoxy resin, a liquid epoxy resin having two or more epoxy groups in one molecule thereof is preferable. As the solid epoxy resin, a solid epoxy resin having three or more epoxy groups in one molecule thereof is preferable.

The liquid epoxy resin is preferably a bisphenol A epoxy resin, a bisphenol F epoxy resin, a bisphenol AF epoxy resin, a naphthalene epoxy resin, a glycidyl ester epoxy resin, a glycidyl amine epoxy resin, a phenol novolak epoxy resin, an alicyclic epoxy resin having an ester skeleton, a cyclohexane epoxy resin, a cyclohexane dimethanol epoxy resin, and a glycidyl amine epoxy resin. The liquid epoxy resin is more preferably a naphthalene epoxy resin and a bisphenol A epoxy resin.

Specific examples of the liquid epoxy resin include "HP-4032", "HP-4032D", and "HP-4032SS" (these are naphthalene epoxy resins: manufactured by DIC Corp.); "828US", "jER828EL", "825", and "Epikote 828EL" (these are bisphenol A epoxy resins: manufactured by Mitsubishi Chemical Corp.); "jER807" and "1750" (both are bisphenol F epoxy resins: manufactured by Mitsubishi Chemical Corp.); "jER152" (phenol novolak epoxy resin: manufactured by Mitsubishi Chemical Corp.); "630" and "630LSD" (both are glycidyl amine epoxy resins: manufactured by Mitsubishi Chemical Corp.); "ZX1059" (a mixture of a bisphenol A epoxy resin and a bisphenol F epoxy resin: manufactured by Nippon Steel Chemical & Materials Co., Ltd.); "EX-721" (a glycidyl ester epoxy resin: manufactured by Nagase ChemteX Corp.); "CEL2021P" (an alicyclic epoxy resin having an ester skeleton: manufactured by Daicel Corp.); "ZX1658" and "ZX1658GS" (both are liquid 1,4-glycidyl cyclohexane epoxy resins: manufactured by Nippon Steel Chemical & Materials Co., Ltd.); "630LSD" (a glycidyl amine epoxy resin: manufactured by Mitsubishi Chemical Corp.); "EXA-850CRP" (a bisphenol A epoxy resin: manufactured by DIC Corp.); "EP-3950S" and "EP-3980S" (both are glycidyl amine epoxy resins: manufactured by ADEKA Corp.); and "ELM-100H" (a glycidyl amine epoxy resin: manufactured by Sumitomo Chemical Co., Ltd.). These may be used singly or as a combination of two or more of them.

The solid epoxy resin is preferably a bixylenol epoxy resin, a naphthalene epoxy resin, a naphthalene four-functional epoxy resin, a cresol novolak epoxy resin, a dicyclopentadiene epoxy resin, a trisphenol epoxy resin, a naphthol epoxy resin, a biphenyl epoxy resin, a naphthylene ether epoxy resin, an anthracene epoxy resin, a bisphenol A epoxy resin, a bisphenol AF epoxy resin, and a tetraphenylethane epoxy resin. The solid epoxy resin is more preferably a biphenyl epoxy resin and a bixylenol epoxy resin.

Specific examples of the solid epoxy resin include "HP-4032H" (a naphthalene epoxy resin: manufactured by DIC Corp.); "HP-4700" and "HP-4710" (both are naphthalene four-functional epoxy resins: manufactured by DIC Corp.); "N-690" (a cresol novolak epoxy resin: manufactured by DIC Corp.); "N-695" (a cresol novolak epoxy resin: manufactured by DIC Corp.); "HP-7200", "HP-7200HH", and "HP-7200H" (these are dicyclopentadiene epoxy resins: manufactured by DIC Corp.); "EXA-7311", "EXA-7311-G3", "EXA-7311-G4", "EXA-7311-G4S", "HP6000L", and "HP6000" (these are naphthalene ether epoxy resins: manufactured by DIC Corp.); "EPPN-502H" (a trisphenol epoxy resin: manufactured by Nippon Kayaku Co., Ltd.); "NC7000L" (a naphthol novolak epoxy resin: manufactured by Nippon Kayaku Co., Ltd.); "NC3000H" "NC3000", "NC3000L", and "NC3100" (these are biphenyl epoxy resins: manufactured by Nippon Kayaku Co., Ltd.); "ESN475V" (a naphthalene epoxy resin: manufactured by Nippon Steel Chemical & Materials Co., Ltd.); "ESN485" (a naphthol novolak epoxy resin: manufactured by Nippon Steel Chemical & Materials Co., Ltd.); "YX4000H", "YX4000", and "YL6121" (these are biphenyl epoxy resins: manufactured by Mitsubishi Chemical Corp.); "YX4000HK" (a bixylenol epoxy resin: manufactured by Mitsubishi Chemical Corp.); "YX8800" (an anthracene epoxy resin: manufactured by Mitsubishi Chemical Corp.); "PG-100" and "CG-500" (both are manufactured by Osaka Gas Chemicals Co., Ltd.); "YL7760" (a bisphenol AF epoxy resin: manufactured by Mitsubishi Chemical Corp.); "YL7800" (a fluorene epoxy resin: manufactured by Mitsubishi Chemical Corp.); "jER1010" (a solid bisphenol A epoxy resin: manufactured by Mitsubishi Chemical Corp.); and "jER1031S" (a tetraphenylethane epoxy resin: manufactured by Mitsubishi Chemical Corp.). These may be used singly or as a mixture of two or more of them.

When the liquid epoxy resin and the solid epoxy resin are concurrently used as the (A) component, the mass ratio of them (liquid epoxy resin:solid epoxy resin) is preferably in the range of 1:0.01 to 1:20, and more preferably in the range of 1:0.1 to 1:10, while still more preferably in the range of 1:1 to 1:5.

The epoxy equivalent of the (A) component is preferably 50 to 5,000 g/eq., more preferably 50 to 3,000 g/eq., and still more preferably 80 to 2,000 g/eq., while far more preferably 110 to 1,000 g/eq. Within this range, crosslinking density of the cured product in a resin sheet is sufficient, so that the insulating layer having the surface roughness thereof lowered can be obtained. The epoxy equivalent is a mass of a resin having one equivalent epoxy group. The epoxy equivalent may be measured in accordance with JIS K7236.

The weight-average molecular weight (Mw) of the (A) component is preferably in the range of 100 to 5,000, and more preferably in the range of 250 to 3,000, while still more preferably in the range of 400 to 1,500. The weight-average molecular weight of the epoxy resin is the weight-average molecular weight in terms of polystyrene measured with a gel permeation chromatography (GPC) method.

The content of (A) the epoxy resin is not particularly restricted, and it is preferably 10% by mass or more, more preferably 20% by mass or more, and still more preferably 30% by mass or more, while especially preferably 35% by mass or more, on the basis of 100% by mass of non-volatile components except for (B) the inorganic filler in the resin composition. The upper limit of the content of (A) the epoxy resin is not particularly restricted, and it is preferably 90% by mass or less, more preferably 70% by mass or less, and still more preferably 60% by mass or less, while especially preferably 50% by mass or less, on the basis of 100% by mass of non-volatile components except for (B) the inorganic filler in the resin composition.

(B) Inorganic Filler

The resin composition according to the present invention includes (B) an inorganic filler. In the present invention, the specific surface area of (B) the inorganic filler is 10 m$^2$/g or more. (B) The inorganic filler is included in the state of particle in the resin composition.

An inorganic compound is used as (B) the inorganic filler. Illustrative examples of (B) the inorganic filler include silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium titanate zirconate, barium zirconate, calcium zirconate, zirconium phosphate, and zirconium phosphate tungstate. Among them, in view of clearly obtaining the intended effects of the present invention, silica is especially preferable. Illustrative examples of the silica include amorphous silica, fused silica, crystalline silica, synthesized silica, and hollow silica. Spherical silica is preferable as the silica. (B) The inorganic fillers may be used singly or as a combination of two or more of them with an arbitrary ratio. When the resin composition according to the present invention includes two or more inorganic filler, the specific surface area of the entire inorganic filler may be 10 m$^2$/g or more.

Specific surface area of (B) the inorganic material is preferably 10 m$^2$/g or more. In view of clearly obtaining the intended effects of the present invention, the specific surface area thereof is more preferably 15 m$^2$/g or more, and still more preferably 18 m$^2$/g or more, while especially preferably 20 m$^2$/g or more. The upper limit of the specific surface area of (B) the inorganic material is not particularly restricted; and it can be, for example, 500 m$^2$/g or less, 300 m$^2$/g or less, 100 m$^2$/g or less, 50 m$^2$/g or less, 40 m$^2$/g or less, 30 m$^2$/g or less, 25 m$^2$/g or less, or the like. The specific surface area of (B) the inorganic material may be calculated by means of a BET multipoint method, in which a nitrogen gas is adsorbed onto the sample surface in accordance with a BET method by using a specific surface area measurement apparatus (Macsorb HM-1210: manufactured by Mountech Co. Ltd.).

The average particle diameter of (B) the inorganic filler is not particularly restricted, and it is preferably 0.05 μm or more, more preferably 0.1 μm or more, and still more preferably 0.12 μm or more, while especially preferably 0.14 μm or more. The upper limit of the average particle diameter of (B) the inorganic filler is not particularly restricted, and it is preferably 10.0 μm or less, or 5.0 μm or less, more preferably 3.0 μm or less, or 2.0 μm or less, and still more preferably 1.0 μm or less, or 0.7 μm or less, while especially preferably 0.5 μm or less, or 0.3 μm or less.

The average particle diameter of (B) the inorganic filler may be measured with a laser diffraction scattering method based on the Mie scattering theory. Specifically, the particle diameter distribution of the particles thereof on the volume basis is prepared by using a laser diffraction scattering type particle diameter distribution measurement apparatus; and the average particle diameter thereof may be measured as a median diameter from this particle diameter distribution. The particles dispersed in a solvent such as water by means of an ultrasonic wave can be preferably used as the measurement sample. Illustrative examples of the laser diffraction scattering type particle diameter distribution measurement apparatus include HLA-500H (manufactured by Horiba Ltd.) and "SALD-2200" (manufactured by Shimadzu Corp.).

Illustrative examples of (B) the inorganic filler include "UFP-20", "UFP-30", and "SFP-20M" (these are manufactured by Denka Co., Ltd.); "Silfil NSS-3N", "Silfil NSS-4N", and "Silfil NSS-5N" (these are manufactured by Tokuyama Corp.); and "SO-C1", "SO-E1", "YC100C", "YA050C", and "YA010C" (these are manufactured by Admatechs Co., Ltd.).

It is preferable that (B) the inorganic filler is surface-modified with a suitable surface modifying agent. With this surface modification, a humidity resistance and a dispersion property of (B) the inorganic filler can be enhanced. Illustrative examples of the surface modifying agent include silane coupling agents such as: vinyl silane coupling agents such as vinyltrimethoxysilane, and vinyltriethoxysilane; epoxy silane coupling agents such as 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane; styryl silane coupling agents such as p-styryltrimethoxysilane; methacryl coupling agents such as 3-methacryloxypropylmethyldimethoxysilane, 3-methacryloxypropyltrimethoxysilane, 3-methacryloxypropylmethyldiethoxysilane, and 3-methacryloxypropyltriethoxysilane; acryl coupling agents such as 3-acryloxypropyltrimethoxysilane; amino silane coupling agents such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-phenyl-8-aminooctyltrimethoxysilane, and N-(vinylbenzyl)-2-aminoethyl-3-aminopropyltrimethoxysilane; isocyanurate silane coupling agents such as tris-(trimethoxysilylpropyl) isocyanurate; ureido silane coupling agents such as 3-ureidopropyltrialkoxysilane; mercapto silane coupling agents such as 3-mercaptopropylmethyldimethoxysilane, and 3-mercaptopropyltrimethoxysilane; isocyanate silane coupling agents such as 3-isocyanatepropyltriethoxysilane; acid anhydride silane coupling agents such as 3-trimethoxysilylpropylsuccinic anhydride; and non-silane coupling-alkoxy silane compounds such as methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, 1,6-bis(trimethoxysilyl)hexane, and trifluoropropyltrimethoxysilane. These surface modifying agents may be used singly or as a combination of two or more of them with an arbitrary ratio.

The degree of the surface modification by the surface modifying agent may be evaluated by the carbon amount per unit surface area of (B) the inorganic filler. In view of enhancement of the dispersion property of (B) the inorganic filler, the carbon amount per unit surface area of (B) the inorganic filler is preferably 0.02 mg/m$^2$ or more, and more preferably 0.1 mg/m$^2$ or more, while especially preferably 0.2 mg/m$^2$ or more. On the other hand, in view of prevention of the increase in the melt viscosity of the resin composition and in the melt viscosity in the sheet form thereof, the carbon amount is preferably 1 mg/m$^2$ or less, and more preferably 0.8 mg/m$^2$ or less, while especially preferably 0.5 mg/m$^2$ or less.

The carbon amount per unit surface area of (B) the inorganic filler may be measured after (B) the inorganic filler whose surface has been modified is cleaned by a solvent (for example, methyl ethyl ketone (hereinafter this is also simply called "MEK")). Specifically, (B) the inorganic filler whose surface has been modified with a surface modifying agent is mixed with a sufficient amount of MEK, and is subjected to ultrasonic cleaning at 25° C. for 5 minutes. Then, the supernatant solution thereof is removed; and after the solid portion remained is dried, the carbon amount per unit surface area of (B) the inorganic filler may be measured by using a carbon analysis apparatus. "EMIA-320V" manufactured by Horiba Ltd. may be used as the carbon analysis apparatus.

The content of (B) the inorganic filler in the resin composition is not particularly restricted, and it is preferably 10% by mass or more, more preferably 20% by mass or more, and still more preferably 30% by mass or more, while especially preferably 40% by mass or more, on the basis of 100% by mass of non-volatile components in the resin composition. Although the upper limit of the content of (B) the inorganic filler is not particularly limited, it is preferably 95% by mass or less, more preferably 90% by mass or less, and still more preferably 80% by mass or less, while especially preferably 70% by mass or less, on the basis of 100% by mass of non-volatile components in the resin composition.

(C) Particulate or Non-Particulate Elastomer

The resin composition according to the present invention includes (C) a particulate or a non-particulate elastomer. The elastomer in the present invention means a resin having flexibility. The elastomer is a particulate resin component capable of maintaining a particle form in the resin composition (particulate elastomer), or an amorphous non-particulate resin component having a tendency to be mixed with or dissolved in the resin composition (non-particulate elastomer). The elastomer is preferably a resin exhibiting rubber elasticity by itself or a resin exhibiting rubber elasticity by reacting with other components. The resin exhibiting rubber elasticity is, for example, a resin exhibiting an elastic modulus of 1 GPa or less upon executing an elongation test in accordance with Japanese Industry Standard (JIS K7161) at 25° C. and the humidity of 40% RH.

The particulate elastomer is preferably spherical.

Illustrative examples of the particulate elastomer include rubber particles such as: diene type rubber particles such as styrene-butadiene rubber (SBR) particles, isoprene rubber (IR) particles (including natural rubber (NR) particles), butadiene rubber (BR) particles, chloroprene rubber (CR) particles, and acrylonitrile-butadiene rubber (NBR) particles (including hydrogenated nitrile rubber (HNBR) particle); and non-diene type rubber particles such as butyl rubber (IIR) particles, ethylene-propylene rubber (EPM) particles (including ethylene-propylene-diene rubber (EPDM) particles), urethane rubber (U) particles (including polyester urethane rubber (AU) particles and polyether urethane rubber (EU) particles), silicone rubber (Q) particles (including methyl silicone rubber (MQ) particles, vinyl-methyl silicone rubber (VMQ) particles, phenyl-methyl silicone rubber (PMQ) particles, fluoro silicone rubber (FVMQ) particles), chlorosulfonated polyethylene rubber (CSM) particles, chlorinated polyethylene rubber (CM) particles, acryl rubber (ACM and ANM) particles, epichlorohydrin rubber (CO) particles (including epichlorohydrin-ethylene oxide rubber (ECO) particles), polysulfide rubber (T) particles, and fluorine-containing rubber (FKM) particles (including tetrafluoroethylene-propylene rubber (FEPM) particles and tetrafluoroethylene-perfluorovinyl ether rubber (FFKM) particles). Among them, urethane rubber particles are preferable.

Illustrative examples of the particulate elastomer include "MM-101SM (average particle diameter of 0.07 to 0.1 μm) and "MM-101SMA (average particle diameter of 0.1 to 0.2 μm)" (both are urethane rubber particles: manufactured by Negami Chemical Industrial Co., Ltd.); "Metablen W300A (average particle diameter of 0.1 μm)" and "W450A (average particle diameter of 0.2 μm)" (both are acryl rubber particles: manufactured by Mitsubishi Rayon Co., Ltd.); "XER-91 (average particle diameter of 0.5 μm)" (acrylonitrile-butadiene rubber particles: manufactured by JSR Corp.); and "XSK-500 (average particle diameter of 0.5 μm)" (styrene-butadiene rubber particles: manufactured by JSR Corp.). These may be used singly or as a combination of two or more of them.

The average particle diameter of the particulate elastomer is 0.8 μm or less; in view of clearly obtaining the intended effects of the present invention, the particle diameter thereof is preferably 0.5 μm or less, and more preferably 0.3 μm or less, while especially preferably 0.2 μm or less. The lower limit of the average particle diameter of the particulate elastomer is not particularly restricted; and it can be, for example, 0.005 μm or more, 0.01 μm or more, 0.03 μm or more, or 0.05 μm or more, or the like. The average particle diameter of the particulate elastomer to be used in the present invention can be measured by using a dynamic light scattering method. For example, rubber particles are uniformly dispersed in a suitable organic solvent by means of a ultrasonic wave or the like; and then, the particle diameter distribution of the rubber particles on the mass basis is prepared by means of a fiber-optics particle analyzer (FPAR-1000: manufactured by Otsuka Electronics Co., Ltd.). The average particle diameter thereof may be measured as a median diameter (d50) on the mass basis.

The non-particulate elastomer is preferably a resin having in the molecule thereof one or more structures selected from the group consisting of a polybutadiene structure, a polysiloxane structure, a poly(meth)acrylate structure, a polyalkylene structure, a polyalkylene oxy structure, a polyisoprene structure, a polyisobutylene structure, and a polycarbonate structure. In view of obtaining a material having flexibility, this elastomer is more preferably a resin having one or more structures selected from a polybutadiene structure and a polycarbonate structure, while especially preferably a resin having a polybutadiene structure in the molecule thereof. Here, "(meth)acrylate" means a methacrylate and an acrylate.

The polybutadiene structure includes not only a structure formed by polymerization of butadiene but also a structure formed by hydrogenation of this structure. The butadiene structure may be partially hydrogenated or totally hydrogenated in its structure. In the non-particulate elastomer, the polybutadiene structure may be included in a main chain or in a side chain thereof.

Preferable examples of the polybutadiene resin includes a resin having a hydrogenated polybutadiene skeleton, a polybutadiene resin having a hydroxy group, a polybutadiene resin having a phenolic hydroxy group, a polybutadiene resin having a carboxy group, a polybutadiene resin having an acid anhydride group, a polybutadiene resin having an epoxy group, a polybutadiene resin having an isocyanate group, and a polybutadiene resin having a urethane group. Among them, a polybutadiene resin having a phenolic hydroxy group and a polybutadiene resin having an epoxy group are more preferable. Here, "the resin having a hydrogenated polybutadiene skeleton" means a resin in which at least part of the polybutadiene skeleton is hydrogenated; and thus, the resin is not necessarily hydrogenated in the entire polybutadiene skeleton thereof. The resin having a hydrogenated polybutadiene skeleton includes, for example, an epoxy resin having a hydrogenated polybutadiene skeleton. Preferable examples of the polybutadiene resin having a phenolic hydroxy group include a resin prepared from raw materials, which are a polybutadiene terminated with a hydroxy group, a diisocyanate compound, and a resin having a phenolic hydroxy group. Here, the polybutadiene terminated with a hydroxy group and the diisocyanate compound may be the same as those described below as examples. Illustrative examples of the resin having a phenolic hydroxy group include a cresol novolak resin.

Specific examples of the polybutadiene resin include: "PB-3600" (a polybutadiene having an epoxy group: manufactured by Daicel Corp.); "JP-100" and "JP-200" (both are polybutadienes having an epoxy group: manufactured by Nippon Soda Co., Ltd.); "Ricon 657" (a polybutadiene having an epoxy group: manufactured by Cray Valley Inc.); "Ricon 130MA8", "Ricon 130MA13", "Ricon 130MA20", "Ricon 131MA5", "Ricon 131MA10", "Ricon 131MA17", "Ricon 131MA20", and "Ricon 184MA6" (these are polybutadienes having an acid anhydride group: manufactured by Cray Valle Inc.); "GQ-1000" (polybutadiene introduced with a hydroxy group and a carboxy group: manufactured by Cray Valley Inc.); "G-1000", "G-2000", and "G-3000" (these are polybutadienes having hydroxy groups at both terminals thereof: manufactured by Cray Valley Inc.); "GI-1000", "GI-2000", and "GI-3000" (these are hydrogenated polybutadienes having hydroxy groups at both terminals thereof: manufactured by Cray Valley Inc.); "PB3600" and "PB4700" (both are epoxy compounds having a polybutadiene skeleton: manufactured by Daicel Corp.); "Epofriend A1005", "Epofriend A1010", and "Epofriend A1020" (these are epoxy compounds of styrene, butadiene, and styrene block copolymer: manufactured by Daicel Corp.); "FCA-061L" (an epoxy compound having a hydrogenated polybutadiene skeleton: manufactured by Nagase ChemteX Corp.); and "R-45EPT" (an epoxy compound having a polybutadiene skeleton: manufactured by Nagase ChemteX Corp.).

Preferable examples of the polybutadiene resin also include a linear polyimide prepared from raw materials, which are a polybutadiene terminated with a hydroxy group, a diisocyanate compound, and a polybasic acid or an anhydride thereof (Japanese Patent Laid-open No. 2006-37083 and International Publication No. 2008/153208). The content rate of the polybutadiene structure in the polyimide resin is preferably in the range of 60 to 95% by mass, while more preferably in the range of 75 to 85% by mass. For details of the polyimide resin, the descriptions of Japanese Patent Laid-open No. 2006-37083 and International Publication No. 2008/153208 can be taken into consideration; and the contents thereof are incorporated into this specification.

The number-average molecular weight of the polybutadiene terminated with a hydroxy group is preferably in the range of 500 to 5,000, while more preferably in the range of 800 to 3,500. The hydroxy equivalent of the polybutadiene terminated with a hydroxy group is preferably in the range of 250 to 5,000 g/eq., while more preferably in the range of 1,000 to 3,000 g/eq.

Illustrative examples of the diisocyanate compound include: aromatic diisocyanates such as toluene-2,4-diisocyanate, toluene-2,6-diisocyanate, xylylene diisocyanate, and diphenylmethane diisocyanate; aliphatic diisocyanates such as hexamethylene diisocyanate; and alicyclic diisocyanates such as isophorone diisocyanate. Among them, aromatic diisocyanates are preferable, while toluene-2,4-diisocyanate is more preferable.

Illustrative examples of the polybasic acid or the anhydride thereof include: tetrabasic acids and the derivatives thereof such as ethylene glycol bistrimellitic acid, pyromellitic acid, benzophenone tetracarboxylic acid, biphenyl tetracarboxylic acid, naphthalene tetracarboxylic acid, 5-(2, 5-dioxotetrafurfuryl)-3-methyl-cyclohexene-1,2-dicarboxylic acid, and 3,3'-4,4'-diphenylsulfone tetracarboxylic acid; tribasic acids and the anhydrides thereof such as trimellitic acid, and cyclohexane tricarboxylic acid; and 1,3,3a,4,5,9b-hexahydro-5-(tetrahydro-2,5-dioxo-3-furanyl)-naphtho(1,2-C)furan-1,3-dione.

The polybutadiene resin can include a polystyrene structure obtained by polymerization of styrene.

Specific examples of the polystyrene resin, which is the resin having a polystyrene structure in the molecule thereof, include a styrene-butadiene-styrene block copolymer (SBS), a styrene-isoprene-styrene block copolymer (SIS), a styrene-ethylene-butylene-styrene block copolymer (SEBS), a styrene-ethylene-propylene-styrene block copolymer (SEPS), a styrene-ethylene-ethylene-propylene-styrene block copolymer (SEEPS), a styrene-butadiene-butylene-styrene block copolymer (SBBS), a styrene-butadiene diblock copolymer, a hydrogenated styrene-butadiene block copolymer, a hydrogenated styrene-isoprene block copolymer, and a hydrogenated styrene-butadiene random copolymer.

A commercially available polystyrene resin may be used. Illustrative examples thereof include: "H1041", "Tuftec H1043", "Tuftec P2000", and "Tuftec MP10" (all are hydrogenated styrene type thermoplastic elastomers: manufactured by Asahi Kasei Corp.); "Epofriend AT501" and "CT310" (both are epoxidized styrene-butadiene type thermoplastic elastomers: manufactured by Daicel Corp.); "Septon HG252" (modified styrene type elastomer having a hydroxy group: manufactured by Kuraray Co., Ltd.); "Tuftec N503M" (a modified styrene type elastomer having a carboxy group), "Tuftec N501" (a modified styrene type elastomer having an amino group), and "Tuftec M1913" (a modified styrene type elastomer having an acid anhydride group), all three of them being manufactured by Asahi Kasei Chemicals Corp.; and "Septon S8104" (an unmodified styrene type elastomer: manufactured by Kuraray Co., Ltd.). The (C) component may be used singly or a combination of two or more of these resins.

The polysiloxane structure is the structure including a siloxane bond; and this is included, for example, in a silicone rubber. The polysiloxane structure may be included in a main chain or in a side chain in the non-particulate elastomer molecule.

Illustrative examples of the polysiloxane resin, which is the resin having the polysiloxane structure in the molecule thereof, include "SMP-2006", "SMP-2003PGMEA", and "SMP-5005PGMEA" (all are manufactured by Shin-Etsu Silicone Co., Ltd.); and a linear polyimide prepared from raw materials of a polysiloxane terminated with an amine group and a tetrabasic acid anhydride (International Publication No. 2010/053185).

The poly(meth)acrylate structure is the structure formed by polymerizing acrylic acid or an acrylate ester, and includes also the structure formed by polymerizing methacrylic acid or a methacrylate ester. The (meth)acrylate structure may be included in a main chain or in a side chain in the non-particulate elastomer molecule.

Preferable examples of the poly(meth)acrylate resin, which is the resin having the poly(meth)acrylate structure in the molecule thereof, include a poly(meth)acrylate resin having a hydroxy group, a poly(meth)acrylate resin having a phenolic hydroxy group, a poly(meth)acrylate resin having a carboxy group, a poly(meth)acrylate resin having an acid anhydride group, a poly(meth)acrylate resin having an epoxy group, a poly(meth)acrylate resin having an isocyanate group, and a poly(meth)acrylate resin having a urethane group.

Specific Examples of the poly(meth)acrylate resin include: Teisan Resin "SG-70L", "SG-708-6", "WS-023", "SG-700AS", and "SG-280TEA" (these are acrylate ester copolymer resins having a carboxy group: acid value of 5 to 34 mgKOH/g; weight-average molecular weight of 400,000 to 900,000; Tg of −30 to 5° C.); "SG-80H", "SG-80H-3", and "SG-P3" (these are acrylate ester copolymer resins having an epoxy group: epoxy equivalent of 4,761 to 14,285 g/eq.; weight-average molecular weight of 350,000 to 850,000; Tg of 11 to 12° C.); and "SG-600TEA" and "SG-790" (both are acrylate ester copolymer resins having a hydroxy group: hydroxy value of 20 to 40 mgKOH/g; weight-average molecular weight of 500,000 to 1,200,000; Tg of −37 to −32° C.); all of the above resins being manufactured by Nagase Chemtex Corp.; "ME-2000" and "W-116.3" (both are acrylate ester copolymer resins having a carboxy group); "W-197C" (an acrylate ester copolymer resin having a hydroxy group); and "KG-25" and "KG-3000" (both are acrylate ester copolymer resins having an epoxy group); all of these resins being manufactured by Negami Chemical Industrial Co., Ltd.

It is preferable that the polyalkylene structure have a predetermined carbon atom number. Specifically, the carbon atom number of the polyalkylene structure is preferably 2 or more, and more preferably 3 or more, while especially preferably 5 or more; and preferably 15 or less, and more preferably 10 or less, while especially preferably 6 or less. The polyalkylene structure may be included in a main chain or in a side chain in the non-particulate elastomer molecule.

It is preferable that the polyalkylene oxy structure have a predetermined carbon atom number. Specifically, the carbon atom number of the polyalkylene oxy structure is preferably 2 or more, and more preferably 3 or more, while especially preferably 5 or more; and preferably 15 or less, and more preferably 10 or less, while especially preferably 6 or less. The polyalkylene oxy structure may be included in a main chain or in a side chain in the non-particulate elastomer molecule.

Specific examples of the polyalkylene resin, which is the resin having a polyalkylene structure in the molecule thereof, and of the polyalkylene oxy resin, which is the resin having a polyalkylene oxy structure in the molecule thereof, include "PTXG-1000" and "PTXG-1800" (both are manufactured by Asahi Kasei Fibers Corp.); "YX-7180" (a resin having an alkylene structure having an ether bond: manufactured by Mitsubishi Chemical Corp.); "EXA-4850-150", "EXA-4816", and "EXA-4822" (these are manufactured by DIC Corp.); "EP-4000", "EP-4003", "EP-4010", and "EP-4011" (these are manufactured by ADEKA Corp.); "BEO-60E" and "BPO-20E" (both are manufactured by New Japan Chemical Co., Ltd.); and "YL7175" and "YL7410" (both are manufactured by Mitsubishi Chemical Corp.).

The polyisoprene structure may be included in a main chain or in a side chain in the non-particulate elastomer molecule. Specific examples of the polyisoprene resin, which is the resin having the polyisoprene structure in the molecule thereof, include "KL-610" and "KL-613" (both are manufactured by Kuraray Co., Ltd.).

The polyisobutylene structure may be included in a main chain or in a side chain in the non-particulate elastomer molecule. Specific examples of the polyisobutylene resin, which is the resin having the polyisobutylene structure in the molecule thereof, include "SIBSTAR-073T" (a styrene-isobutylene styrene triblock copolymer) and "SIBSTAR-042D" (a styrene-isobutylene diblock copolymer), both being manufactured by Kaneka Corp.

The polycarbonate structure may be included in a main chain or in a side chain in the non-particulate elastomer molecule.

Preferable examples of the polycarbonate resin, which is the resin having the polycarbonate structure in the molecule thereof, include a polycarbonate resin having a hydroxy group, a polycarbonate resin having a phenolic hydroxy group, a polycarbonate resin having a carboxy group, a polycarbonate resin having an acid anhydride group, a polycarbonate resin having an epoxy group, a polycarbonate resin having an isocyanate group, and a polycarbonate resin having a urethane group.

Specific examples of the polycarbonate resin include "T6002" and "T6001" (both are polycarbonate diols: manufactured by Asahi Kasei Chemicals Corp.); and "C-1090", "C-2090", and "C-3090" (these are polycarbonate diols: manufactured by Kuraray Co., Ltd.).

Preferable examples of the polycarbonate resin may also be a polycarbonate terminated with a hydroxy group and a linear polyimide prepared from the raw materials, which are a diisocyanate compound and a polybasic acid or an acid anhydride thereof. This linear polyimide has a urethane structure and a polycarbonate structure. The content rate of the polycarbonate structure in this polyimide resin is preferably in the range of 60 to 95% by mass, while more preferably in the range of 75 to 85% by mass. For details of the polyimide resin, the specification of the International Publication No. 2016/129541 can be taken into consideration; and the content thereof is incorporated into this specification.

The number-average molecular weight of the polycarbonate terminated with a hydroxy group is preferably in the range of 500 to 5,000, while more preferably in the range of 1,000 to 3,000. The hydroxy equivalent of the polycarbonate terminated with a hydroxy group is preferably in the range of 250 to 1,250.

It is preferable that the non-particulate elastomer further have an imide structure. The imide structure included therein can enhance the heat resistance of the non-particulate elastomer, and thus, it can effectively enhance the crack resistance thereof.

Although the structure of the non-particulate elastomer may be any of linear, branched, and cyclic, it is preferably linear.

It is preferable that the non-particulate elastomer further has a functional group capable of reacting with the (A) component. This functional group includes a reactive group that emerges by heating. The non-particulate elastomer having the functional group can enhance a mechanical strength of a cured product of the resin composition.

Illustrative examples of the functional group include a carboxy group, a hydroxy group, an acid anhydride group, a phenolic hydroxy group, an epoxy group, an isocyanate group, and a urethane group. Among them, in view of clearly obtaining the effects of the present invention, it is preferable to include one or more functional groups selected from the group consisting of a hydroxy group, an acid anhydride group, a phenolic hydroxy group, an epoxy group, an isocyanate group, and a urethane group, while especially preferably a phenolic hydroxy group is included therein.

The non-particulate elastomer may be used singly or as a combination of two or more of these elastomers.

Specifically, the number-average molecular weight Mn of the non-particulate elastomer is preferably 500 or more, more preferably 800 or more, and still more preferably 1,000 or more, while especially preferably 1,200 or more; and preferably 100,000 or less, and more preferably 50,000 or less, while especially preferably 10,000 or less. The number-average molecular weight Mn of the non-particulate elastomer is the number-average molecular weight, in terms of polystyrene, measured by means of GPC (gel permeation chromatography).

When the non-particulate elastomer has a functional group, a functional equivalent of the non-particulate elastomer is preferably 100 g/eq. or more, more preferably 200 g/eq. or more, and still more preferably 1,000 g/eq. or more, while especially preferably 2,500 g/eq. or more; and preferably 50,000 g/eq. or less, more preferably 30,000 g/eq. or less, and still more preferably 10,000 g/eq. or less, while especially preferably 5,000 g/eq. or less. The functional equivalent is the weight (g) of the resin that includes 1 g equivalent of a functional group. For example, the epoxy equivalent may be measured in accordance with JIS K7236. For example, the hydroxy equivalent may be calculated by dividing a molecular weight of KOH with the hydroxy value measured in accordance with JIS K1557-1.

The glass transition temperature (Tg) of (C) the particulate or the non-particulate elastomer is preferably 20° C. or lower, and more preferably 10° C. or lower, while still more preferably 0° C. or lower.

The content of (C) the particulate or the non-particulate elastomer is 35% by mass or less; in view of clearly obtaining the intended effects of the present invention, the content is preferably 30% by mass or less, and more preferably 27% by mass or less, while especially preferably 25% by mass or less, on the basis of 100% by mass of non-volatile components except for (B) the inorganic filler in the resin composition. The lower limit of the content of (C) the particulate or the non-particulate elastomer is not particularly restricted, and it is preferably 0.1% by mass or more, more preferably 1% by mass or more, and still more preferably 3% by mass or more, while especially preferably 5% by mass or more, on the basis of 100% by mass of non-volatile components except for (B) the inorganic filler in the resin composition.

(D) Curing Agent

The resin composition according to the present invention can contain (D) a curing agent as an arbitrary component. (D) The curing agent has a function to cure (A) the epoxy resin.

(D) The curing agent is not particularly restricted, and illustrative examples thereof include a phenol type curing agent, a naphthol type curing agent, an acid anhydride type curing agent, an active ester type curing agent, a benzoxazine type curing agent, a cyanate ester type curing agent, and a carbodiimide type curing agent. It is preferable that (D) the curing agent include an active ester type curing agent. The curing agent may be used singly or as a combination of two or more of these curing agents.

In view of a heat resistance and a water resistance, it is preferable that the phenol type curing agent and the naphthol type curing agent are a phenol type curing agent having a novolak structure or a naphthol type curing agent having a novolak structure. In view of the adhesion property to a body to be adhered, a nitrogen-containing phenol type curing agent or a nitrogen-containing naphthol type curing agent is preferable, while a phenol type curing agent having a triazine skeleton or a naphthol type curing agent having a triazine skeleton is more preferable. In particular, in view of highly satisfactory heat resistance, water resistance, and adhesion property, a phenol novolak resin having a triazine skeleton is preferable. Specific examples of the phenol type curing agent and the naphthol type curing agent include: "MEH-7700", "MEH-7810", and "MEH-7851" (these are manufactured by Meiwa Plastic Industries, Ltd.); "NHN", "CBN", and "GPH" (these are manufactured by Nippon Kayaku Co., Ltd.); "SN-170", "SN-180", "SN-190", "SN-475", "SN-485", "SN-495", "SN-375", and "SN-395" (these are manufactured by Nippon Steel Chemical & Materials Co., Ltd.); and "LA-7052", "LA-7054", "LA-3018", "LA-3018-50P", "LA-1356", "TD2090", and "TD-2090-60M" (these are manufactured by DIC Corp.).

The acid anhydride type curing agent may be a curing agent having one or more acid anhydride groups in one molecule thereof. Specific examples of the acid anhydride type curing agent include phthalic anhydride, tetrahydrophthalic anhydride, hexahydrophthalic anhydride, methyltetrahydrophthalic anhydride, methylhexahydrophthalic anhydride, methyl nadic anhydride, hydrogenated methyl nadic anhydride, trialkyl tetrahydrophthalic anhydride, dodecenyl succinic anhydride, 5-(2,5-dioxotetrahydro-3-furanyl)-3-methyl-3-cyclohexene-1,2-dicarboxylic anhydride, trimellitic anhydride, pyromellitic anhydride, benzophenonetetracarboxylic dianhydride, biphenyltetracarboxylic dianhydride, naphthalenetetracarboxylic dianhydride, oxydiphthalic dianhydride, 3,3'-4,4'-diphenylsulfonetetracarboxylic dianhydride, 1,3,3a,4,5,9b-hexahydro-5-(tetrahydro-2,5-dioxo-3-furanyl)-naphto[1,2-C]furan-1,3-dione, ethylene glycol bis(anhydrotrimellitate), and a polymer type acid anhydride such as a styrene-maleic acid resin, which is a copolymer of styrene and maleic acid. Illustrative examples of the acid anhydride type curing agent that is commercially available include "HNA-100" and "MH-700" (both are manufactured by New Japan Chemical Co., Ltd.).

There is no particular restriction in the active ester type curing agent. In general, compounds having two or more ester groups having a high reactivity in one molecule can be preferably used, such as a phenol ester, a thiophenol ester, an N-hydroxylamine ester, and an ester of a heterocyclic hydroxy compound. The active ester type curing agent is preferably a compound that is obtained by a condensation reaction of a carboxylic acid compound and/or a thiocarboxylic acid compound with a hydroxy compound and/or a thiol compound. Especially, in view of enhancement of a heat resistance, an active ester type curing agent obtained from a carboxylic acid compound and a hydroxy compound is preferable, while an active ester type curing agent obtained from a carboxylic acid compound and a phenol compound and/or a naphthol compound is more preferable. Illustrative examples of the carboxylic acid compound include benzoic acid, acetic acid, succinic acid, maleic acid, itaconic acid, phthalic acid, isophthalic acid, terephthalic acid, and pyromellitic acid.

Illustrative examples of the phenol compound or the naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, a dicyclopentadiene type diphenol compound, and phenol novolak. Here, the "dicyclopentadiene type diphenol compound" means the diphenol compound obtained by condensation of one dicyclopentadiene molecule with two phenol molecules.

Specifically, an active ester compound containing a dicyclopentadiene type diphenol structure, an active ester compound containing a naphthalene structure, an active ester compound containing an acetylated phenol novolak, and an active ester compound containing a benzoylated phenol novolak are preferable; among them, an active ester compound containing a naphthalene structure and an active ester compound containing a dicyclopentadiene type diphenol structure are more preferable. Here, the "dicyclopentadiene type diphenol structure" means a divalent structure unit formed of phenylene-dicyclopentalene-phenylene.

Illustrative examples of the active ester type curing agent that is commercially available include: as the active ester compounds containing a dicyclopentadiene type diphenol structure, "EXB9451", "EXB9460", "EXB9460S", "HPC-8000", "HPC-8000H", "HPC-8000-65T", "HPC-8000H-65TM", "EXB-8000L", "EXB-8000L-65M", and "EXB-8000L-65TM" (these are manufactured by DIC Corp.); as the active ester compounds containing a naphthalene structure, "EXB9416-70BK", "HPC-8150-60T", and "HPC-8150-65T" (these are manufactured by DIC Corp.); as the active ester compound containing an acetylated phenol novolak, "DC808" (manufactured by Mitsubishi Chemical Corp.); as the active ester compound containing a benzoylated phenol novolak, "YLH1026" (manufactured by Mitsubishi Chemical Corp.); as the active ester type curing agent that is an acetylated phenol novolak, "DC808" (manufactured by Mitsubishi Chemical Corp.); and as the active ester type curing agent that is a benzoylated phenol novolak, "YLH1026" (manufactured by Mitsubishi Chemical Corp.), "YLH1030" (manufactured by Mitsubishi Chemical Corp.), and "YLH1048" (manufactured by Mitsubishi Chemical Corp.).

Specific examples of the benzoxazine type curing agent include "JBZ-OP100D" and "ODA-BOZ" (both are manufactured by JFE Chemical Corp.); "HFB2006M" (manufactured by Showa Highpolymer Co., Ltd.); and "P-d" and "F-a" (both are manufactured by Shikoku Chemicals Corp.).

Illustrative examples of the cyanate ester type curing agent include: bifunctional cyanate resins such as bisphenol A dicyanate, polyphenol cyanate(oligo(3-methylene-1,5-phenylenecyanate)), 4,4'-methylenebis(2,6-dimethylphenylcyanate), 4,4'-ethylidene diphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl) thioether, and bis(4-cyanatephenyl) ether; polyfunctional cyanate resins derived from a phenol novolak, a cresol novolak, and the like; and a prepolymer in which these cyanate resins are partially made to triazine. Specific examples of the cyanate ester type curing agent include "PT30" and "PT60" (both are phenol novolak type polyfunctional cyanate ester resins); and "BA230" and "BA230S75" (both are prepolymers in which part or all of bisphenol A dicyanate is made to triazine so as to be a trimer); all of these agents being manufactured by Lonza Japan Ltd.

Specific examples of the carbodiimide type curing agent include "V-03" and "V-07" (both are manufactured by Nisshinbo Chemical, Inc.).

When the resin composition includes (D) the curing agent, a mass ratio of (A) the epoxy resin to (D) the curing agent, which is the ratio of [total number of the epoxy groups in (A) the epoxy resin] to [total number of the reactive groups in (D) the curing agent], is preferably 1:0.2 to 1:2, and more preferably 1:0.3 to 1:1.5, while still more preferably 1:0.4 to 1:1.2. Here, the reactive group of the curing agent is an active hydroxy group, an active ester group, and the like; and they are different depending on the curing agent.

When the active ester type curing agent is included in (D) the curing agent, the content thereof is not particularly restricted, and it is preferably 10% by mass or more, more preferably 40% by mass or more, and still more preferably 60% by mass or more, while especially preferably 70% by mass or more, on the basis of 100% by mass of the total mass of (D) the curing agent. The upper limit of the content of the active ester type curing agent is not particularly restricted, and it can be, for example, 100% by mass or less, 95% by mass or less, 90% by mass or less, 85% by mass or less, or 80% by mass or less, or the like, on the basis of 100% by mass of the total mass of (D) the curing agent.

When the resin composition includes (D) the curing agent, the content thereof is not particularly restricted, and it is preferably 1% by mass or more, more preferably 10% by mass or more, and still more preferably 20% by mass or more, while especially preferably 30% by mass or more, on the basis of 100% by mass of non-volatile components except for (B) the inorganic filler in the resin composition. The upper limit of the content of (D) the curing agent is not particularly restricted, and it is preferably 80% by mass or less, more preferably 70% by mass or less, and still more preferably 60% by mass or less, while especially preferably 50% by mass or less, on the basis of 100% by mass of non-volatile components except for (B) the inorganic filler in the resin composition.

(E) Curing Accelerator

The resin composition according to the present invention may include, as an arbitrary component, (E) a curing accelerator. (E) The curing accelerator has a function to facilitate to cure (A) the epoxy resin.

(E) The curing accelerator is not particularly restricted, and illustrative examples thereof include a phosphorous type curing accelerator, a urea type curing accelerator, an amine type curing accelerator, an imidazole type curing accelerator, a guanidine type curing accelerator, and a metal type curing accelerator. Among them, a phosphorous type curing accelerator, an amine type curing accelerator, an imidazole type curing accelerator, and a metal type curing accelerator are preferable, while an amine type curing accelerator is more preferable. The curing accelerator may be used singly or as a mixture of two or more of these accelerators.

Illustrative examples of the phosphorous type curing accelerator include: aliphatic phosphonium salts such as tetrabutylphosphonium bromide, tetrabutylphosphonium chloride, tetrabutylphosphonium acetate, tetrabutylphosphonium decanoate, tetrabutylphosphonium laurate, bis(tetrabutylphosphonium) pyromellitate, tetrabutylphosphonium hydrogen hexahydrophthalate, tetrabutylphosphonium cresol novolak trimer salt, and di-tert-butylmethylphosphonium tetraphenylborate; aromatic phosphonium salts such as methyltriphenylphosphonium bromide, ethyltriphenylphosphonium bromide, propyltriphenylphosphonium bromide, butyltriphenylphosphonium bromide, benzyltriphenylphosphonium chloride, tetraphenylphosphonium bromide, p-tolyltriphenylphosphonium tetra-p-tolylborate, tetraphenylphosphonium tetraphenylborate, tetraphenylphosphonium tetra-p-tolylborate, triphenylethylphosphonium tetraphenylborate, tris(3-methylphenyl)ethylphosphonium tetraphenylborate, tris(2-methoxyphenyl)ethylphosphonium tetraphenylborate, (4-methylphenyl)triphenylphosphonium thiocyanate, tetraphenylphosphonium thiocyanate, and butyltriphenylphosphonium thiocyanate; aromatic phosphine-borane complex such as triphenylphosphine-triphenylborane; aromatic phosphine-quinone addition reaction products such as a triphenylphosphine-p-benzoquinone addition reaction product; aliphatic phosphines such as tributyl phosphine, tri-tert-butyl phosphine, trioctyl phosphine, di-tert-butyl (2-butenyl) phosphine, di-tert-butyl (3-methyl-2-butenyl) phosphine, and tricyclohexyl phosphine; and aromatic phosphines such as dibutyl phenyl phosphine, di-tert-butyl phenyl phosphine, methyl diphenyl phosphine, ethyl diphenyl phosphine, butyl diphenyl phosphine, diphenyl cyclohexyl phosphine, triphenyl phosphine, tri-o-tolyl phosphine, tri-m-tolyl phosphine, tri-p-tolyl phosphine, tris(4-ethylphenyl) phosphine, tris(4-propylphenyl) phosphine, tris(4-isopropylphenyl) phosphine, tris(4-butylphenyl) phosphine, tris(4-tert-butylphenyl) phosphine, tris(2,4-dimethylphenyl) phosphine, tris(2,5-dimethylphenyl) phosphine, tris(2,6-dimethylphenyl) phosphine, tris(3,5-dimethylphenyl) phosphine, tris(2,4,6-trimethylphenyl) phosphine, tris(2,6-dimethyl-4-ethoxyphenyl) phosphine, tris(2-methoxyphenyl) phosphine, tris(4-methoxyphenyl) phosphine, tris(4-ethoxyphenyl) phosphine, tris(4-tert-butoxyphenyl) phosphine, diphenyl-2-pyridyl phosphine, 1,2-bis(diphenylphosphino) ethane, 1,3-bis(diphenylphosphino) propane, 1,4-bis(diphenylphosphino) butane, 1,2-bis(diphenylphosphino) acetylene, and 2,2'-bis(diphenylphosphino) diphenyl ether.

Illustrative examples of the urea type curing accelerator include: 1,1-dimethylurea; aliphatic dimethylureas such as 1,1,3-trimethylurea, 3-ethyl-1,1-dimethylurea, 3-cyclohexyl-1,1-dimethylurea, and 3-cyclooctyl-1,1-dimethylurea; and aromatic dimethylureas such as 3-phenyl-1,1-dimethylurea, 3-(4-chlorophenyl)-1,1-dimethylurea, 3-(3,4-dichlorophenyl)-1,1-dimethylurea, 3-(3-chloro-4-methylphenyl)-1,1-dimethylurea, 3-(2-methylphenyl)-1,1-dimethyl urea, 3-(4-methylphenyl)-1,1-dimethylurea, 3-(3,4-dimethylphenyl)-1,1-dimethylurea, 3-(4-isopropylphenyl)-1,1-dimethylurea, 3-(4-methoxyphenyl)-1,1-dimethylurea, 3-(4-nitrophenyl)-1,1-dimethylurea, 3-[4-(4-methoxyphenoxy)phenyl]-1,1-dimethylurea, 3-[4-(4-chlorophenoxy)phenyl]-1,1-dimethylurea, 3-[3-(trifluoromethyl)phenyl]-1,1-dimethylurea, N,N-(1,4-phenylene)bis(N',N'-dimethylurea), and N,N-(4-methyl-1,3-phenylene)bis(N',N'-dimethylurea) [toluene bisdimethylurea].

Illustrative examples of the amine type curing accelerator include: trialkyl amines such as triethyl amine, and tributyl amine; and 4-dimethylaminopyridine (DMAP), benzyl dimethyl amine, 2,4,6-tris(dimethylaminomethyl)phenol, and 1,8-diazabicyclo(5,4,0)-undecene. Among them, 4-dimethylaminopyridine is preferable.

Illustrative examples of the imidazole type curing accelerator include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-bezyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-metylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrro[1,2-a]benzimidazole, 1-dodecyl-2-methyl-3-benzylimidazolium chloride, 2-methylimidazoline, and 2-phenylimidazoline; and adducts of these imidazole compounds with an epoxy resin.

Commercially available imidazole type curing accelerators may be used. Illustrative examples thereof include "P200-H50" manufactured by Mitsubishi Chemical Corp.

Illustrative examples of the guanidine type curing accelerator include dicyandiamide, 1-methylguanidine, 1-ethylguanidine, 1-cyclohexylguanidine, 1-phenylguanidine, 1-(o-tolyl)guanidine, dimethylguanidine, diphenylguanidine, trimethylguanidine, tetramethylguanidine, pentamethylguanidine, 1,5,7-triazabicyclo[4.4.0]deca-5-ene, 7-methyl-1,5,7-triazabicyclo[4.4.0]deca-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide.

Illustrative examples of the metal type curing accelerator include organic metal complexes or organic metal salts of metals such as cobalt, copper, zinc, iron, nickel, manganese, and tin. Specific examples of the organic metal complex include organic cobalt complexes such as cobalt(II) acetylacetonate, and cobalt(III) acetylacetonate; organic copper complexes such as copper(II) acetylacetonate; organic zinc complexes such as zinc(II) acetylacetonate; organic iron complexes such as iron(III) acetylacetonate; organic nickel complexes such as nickel(II) acetylacetonate; and organic manganese complexes such as manganese(II) acetylacetonate. Illustrative examples of the organic metal salt include zinc octylate, tin octylate, zinc naphthenate, cobalt naphthenate, tin stearate, and zinc stearate.

When the resin composition includes (E) the curing accelerator, the content thereof is not particularly restricted, and it is preferably 0.001% by mass or more, more preferably 0.01% by mass or more, and still more preferably 0.05% by mass or more, while it can be especially preferably 0.1% by mass or more, on the basis of 100% by mass of non-volatile components except for (B) the inorganic filler in the resin composition. The upper limit of (E) the curing accelerator is not particularly restricted, and it is preferably 5% by mass or less, more preferably 1% by mass or less, and still more preferably 0.5% by mass or less, while especially preferably 0.3% by mass or less, on the basis of 100% by mass of non-volatile components except for (B) the inorganic filler in the resin composition.

(F) Flame Retardant

The resin composition according to the present invention may include (F) a flame retardant as an arbitrary component. Illustrative examples of (F) the flame retardant include: phosphorous type flame retardants such as a phosphazene compound, a phosphate ester, a phosphinate salt, and phosphinate ester; nitrogen type flame retardants such as an aliphatic amine compound, an aromatic amine compound, a nitrogen-containing heterocyclic compound, and a urea compound; inorganic flame retardants such as antimony trioxide, antimony pentaoxide, and sodium antimonate; and halogen type flame retardants such a brominated polycarbonate resin, a brominated epoxy resin, a brominated phenoxy resin, a brominated polyphenylene ether resin, a brominated polystyrene resin, and a brominated benzyl polyacrylate resin. Among them, phosphorous type flame retardants are preferable. (F) The flame retardant may be used singly, or two or more of these flame retardants may be used concurrently.

Specific examples of (F) the flame retardant include "SPH-100", "SPS-100", "SPB-100", and "SPE-100" (these are phosphazene compounds: manufactured by Otsuka Chemical Co., Ld.); "FP-100", "FP-110", "FP-300", and "FP-400" (these are phosphazene compounds: manufactured by Fushimi Pharmaceutical Co., Ltd.); "HCA-HQ" (phosphinate ester manufactured by Sanko Co., Ltd.); and "PX-200", "PX-201", "PX-202", "CR-733S", "CR-741", and "CR-747" (these are phosphate esters: manufactured by Daihachi Chemical Co., Ltd.).

When the resin composition includes (F) the flame retardants, the content thereof is not particularly restricted, and it is preferably 0.01% by mass or more, more preferably 0.1% by mass or more, and still more preferably 0.5% by mass or more, while especially preferably 1% by mass or more, on the basis of 100% by mass of non-volatile components except for (B) the inorganic filler in the resin composition. The upper limit of the content of (F) the flame retardant is not particularly restricted, and it is preferably 30% by mass or less, more preferably 10% by mass or less, and still more preferably 5% by mass or less, while especially preferably 3% by mass or less, on the basis of 100% by mass of non-volatile components except for (B) the inorganic filler in the resin composition.

(G) Thermoplastic Resin

The resin composition according to the present invention may include (G) a thermoplastic resin as an arbitrary component. Here, (G) the thermoplastic resin is the resin not belonging to the (C) component.

Illustrative examples of (G) the thermoplastic resin include a phenoxy resin, a polyvinyl acetal resin, a polyolefin resin, a polyimide resin, a polyamide imide resin, a polyether imide resin, a polysulfone resin, a polyether sulfone resin, a polyphenylene ether resin, a polyether ether ketone resin, and a polyester resin, while a phenoxy resin is preferable. The (G) component may be used singly or as a combination of two or more of these resins.

The weight-average molecular weight of (G) the thermoplastic resin in terms of polystyrene is preferably 2,000 or more, more preferably 5,000 or more, while still more preferably 10,000 or more. The upper limit thereof is preferably 100,000 or less, and more preferably 70,000 or less, while still more preferably 50,000 or less.

The weight-average molecular weight of the (G) component in terms of polystyrene is measured by a gel permeation chromatography (GPC) method. Specifically, the weight-average molecular weight of the (G) component in terms of polystyrene is calculated by using a calibration curve of a standard polystyrene, measured with a measurement instrument of LC-9A/RID-6A (manufactured by Shimadzu Corp.), columns of Shodex K-800P/K-804L/K-804L (manufactured by Showa Denko K. K.), and a moving phase of chloroform and the like, at 40° C. as the column temperature.

Illustrative examples of the phenoxy resin include phenoxy resins having one or more skeletons selected from the group consisting of a bisphenol A skeleton, a bisphenol F skeleton, a bisphenol S skeleton, a bisphenol acetophenone skeleton, a novolak skeleton, a biphenyl skeleton, a fluorene skeleton, a cyclopentadiene skeleton, a norbornene skeleton, a naphthalene skeleton, an anthracene skeleton, an adamantane skeleton, a terpene skeleton, and a trimethyl cyclohexane skeleton. The terminal of the phenoxy resin may be any functional group such as a phenolic hydroxy group, and an epoxy group. The phenoxy resin may be used singly or as a mixture of two or more of these resins. Specific examples of the phenoxy resin include "1256" and "4250" (both are the phenoxy resins having a bisphenol A skeleton), "YX8100" (a phenoxy resin having a bisphenol S skeleton), and "YX6954" (a phenoxy resin having a bisphenol acetophenone skeleton), these resins being manufactured by Mitsubishi Chemical Corp., as well as "FX280" and "FX293" (both are manufactured by Nippon Steel Chemical & Materials Co., Ltd.), and "YL7500BH30", "YX6954BH30", "YX7553", "YX7553BH30", "YL7769BH30", "YL6794", "YL7213", "YL7290", and "YL7482", these resins being manufactured by Mitsubishi Chemical Corp.

Illustrative examples of the polyvinyl acetal resin include a polyvinyl formal resin and a polyvinyl butyral resin, while a polyvinyl butyral resin is preferable. Specific examples of the polyvinyl acetal resin include: "Denka Butyral 4000-2", "Denka Butyral 5000-A", "Denka Butyral 6000-C", and "Denka Butyral 6000-EP", these resins being manufactured by Denka Co., Ltd.; and Eslec BH Series, BX Series (for example, BX-5Z), KS Series (for example, KS-1), BL series, and BM Series, these resins being manufactured by Sekisui Chemical Co., Ltd.

Specific examples of the polyimide resin include "Rika Coat SN20" and "Rika Coat PN20", both being manufactured by New Japan Chemical Co., Ltd. Specific examples of the polyimide resin also include modified polyimides such as a linear polyimide obtained by reacting a bifunctional polybutadiene terminated with a hydroxy group, a diisocyanate compound, and a tetrabasic acid anhydride (a polyimide described in Japanese Patent Laid-open No. 2006-37083), and polyimides having a polysiloxane skeleton (polyimides described in Japanese Patent Laid-open No. 2002-12667 and Japanese Patent Laid-open No. 2000-319386).

Specific examples of the polyamide imide resin include "Vylomax HR11NN" and "Vylomax HR16NN", both being manufactured by Toyobo Co., Ltd. Specific examples of the polyamide imide resin also include modified polyamide imides such as "KS9100", and "KS9300" (both are polyamide imides having a polysiloxane skeleton: manufactured by Hitachi Chemical Co., Ltd.).

Specific examples of the polyether sulfone resin include "PES5003P" (manufactured by Sumitomo Chemical Co., Ltd.). Specific examples of the polyphenylene ether resin include "OPE-2St 1200" (an oligophenylene ether-styrene resin: manufactured by Mitsubishi Gas Chemical Co., Inc.). Specific examples of the polyether ether ketone resin include "Sumiploy K" (manufactured by Sumitomo Chemical Co., Ltd.). Specific examples of the polyether imide resin include "ULTEM" (manufactured by GE Plastics Inc.).

Specific examples of the polysulfone resin include Polysulfone "P1700"" and "P3500" (manufactured by Solvay Advanced Polymers LLC).

Illustrative examples of the polyolefin resin include low-density polyethylene, ultralow-density polyethylene, high-density polyethylene, as well as ethylenic copolymer resins such as an ethylene-vinyl acetate copolymer, an ethylene-ethyl acrylate copolymer, and an ethylene-methyl methacrylate copolymer.

Illustrative examples of the polyester resin include a polyethylene terephthalate resin, a polyethylene naphthalate resin, a polybutylene terephthalate resin, a polybutylene naphthalate resin, a polytrimethylene terephthalate resin, a polytrimethylene naphthalate resin, and a polycyclohexanedimethyl terephthalate resin.

When the resin composition includes (G) the thermoplastic resin, the content thereof is not particularly restricted, and it is preferably 0.01% by mass or more, more preferably 0.1% by mass or more, and still more preferably 0.5% by mass or more, while especially preferably 1% by mass or more, on the basis of 100% by mass of non-volatile components except for (B) the inorganic filler in the resin composition. The upper limit of the content of (G) the thermoplastic resin is not particularly restricted, and it is preferably 30% by mass or less, more preferably 10% by mass or less, and still more preferably 5% by mass or less, while especially preferably 3% by mass or less, on the basis of 100% by mass of non-volatile components except for (B) the inorganic filler in the resin composition.

(H) Other Additives

The resin composition according to the present invention may further include arbitrary additives as the non-volatile components. Illustrative examples of the additive like this include: organic metal compounds such as an organic copper compound, an organic zinc compound, and an organic cobalt compound; colorants such as phthalocyanine blue, phthalocyanine green, iodine green, diazo yellow, crystal violet, titanium oxide, and carbon black; polymerization inhibitors such as hydroquinone, catechol, pyrogallol, and phenothiazine; leveling agents such as siloxane; thickeners such as bentone, and montmorillonite; antifoaming agents such as a silicone type antifoaming agent, an acryl type antifoaming agent, a fluorine type antifoaming agent, and a vinyl resin type antifoaming agent; UV absorbers such as a benzotriazole type UV absorber; adhesion enhancers such as a urea silane; adhesion assisting agents such as a silane coupling agent, a triazole type adhesion assisting agent, a tetrazole type adhesion assisting agent, and a triazine type adhesion assisting agent; antioxidants such as a hindered phenol type antioxidant, and a hindered amine type antioxidant; fluorescent whitening agents such as a stilbene derivative; and surfactants such as a fluorine type surfactant, and a silicone type surfactant. These additives may be used singly or as a combination of two or more of them with an arbitrary ratio. The contents of (H) the other additives may be readily determined by a person ordinarily skilled in the art.

(I) Organic Solvent

The resin composition according to the present invention may further include, in addition to the non-volatile components described above, an arbitrary organic solvent as a volatile component. Heretofore known solvents may be arbitrarily used as (I) the organic solvent without any particular restriction. Illustrative examples of (I) the organic solvent include: ketone type solvents such as acetone, methyl ethyl ketone, methyl isobutyl ketone, and cyclohexanone; ester type solvents such as methyl acetate, ethyl acetate, butyl acetate, isobutyl acetate, isoamyl acetate, methyl propionate, ethyl propionate, and γ-butyrolactone; ether type solvents such as tetrahydropyran, tetrahydrofuran, 1,4-dioxane, diethyl ether, diisopropyl ether, dibutyl ether, and diphenyl ether; alcohol type solvents such as methanol, ethanol, propanol, butanol, and ethylene glycol; ether ester type solvents such as 2-ethoxyethyl acetate, propylene glycol monomethyl ether acetate, diethylene glycol monoethyl ether acetate, ethyl diglycol acetate, γ-butyrolactone, and methyl methoxypropionate; ester alcohol type solvents such as methyl lactate, ethyl lactate, and methyl 2-hydroxyisobutyrate; ether alcohol type solvents such as 2-methoxypropanol, 2-methoxyethanol, 2-ethoxyethanol, propylene glycol monomethyl ether, and diethylene glycol monobutyl ether (butyl carbitol); amide type solvents such as N,N-dimethylformamide, N,N-dimethylacetamide, and N-methyl-2-pyrrolidone; sulfoxide type solvents such as dimethyl sulfoxide; nitrile type solvents such as acetonitrile, propionitrile; aliphatic hydrocarbon type solvents such as hexane, cyclopentane, cyclohexane, and methylcyclohexane; and aromatic hydrocarbon type solvents such as benzene, toluene, xylene, ethylbenzene, and trimethylbenzene. (I) The organic solvents may be used singly or as a combination of two or more of them with an arbitrary ratio. The contents of (I) the organic solvent may be readily determined by a person ordinarily skilled in the art.

Production Method of the Resin Composition

The resin composition according to the present invention may be produced, for example, by adding and mixing, in an arbitrary reacting vessel, (A) the epoxy resin, (B) the inorganic filler, (C) the particulate or the non-particulate elastomer, as necessary (D) the curing agent, as necessary (E) the curing accelerator, as necessary (F) the flame retardant, as necessary (G) the thermoplastic resin, as necessary (H) the other additives, and as necessary (I) the organic solvent, in an arbitrary order and/or partially or all at once. During the addition and mixing process of these components, the temperature of them can be arbitrarily set; and temporarily or entirely in this process, they may be heated and/or cooled. During the addition and mixing process of these components, they may be stirred or shaken. During the addition and mixing process, or after this process, the resin composition may be stirred by using a stirring apparatus such as, for example, a mixer so as to uniformly disperse the composition.

Characteristics of the Resin Composition

The resin composition according to the present invention includes (A) the epoxy resin, (B) the inorganic filler, and (C) the particulate or the non-particulate elastomer, in which the specific surface area of the (B) component is 10 m$^2$/g or more, the content of the (C) component is 35% by mass or less (component ratio except for the (B) component), and the average particle diameter of the (C) component is 0.8 μm or less; and thus, a warp of the cured product thereof can be suppressed, as well as a superior crack resistance, adhesion property, and formability of a via hole having a small diameter can be accomplished.

In the cured product of the resin composition according to the present invention, a warp thereof can be suppressed; and thus, when a resin composition layer having a thickness of 15 μm and a size of 14 cm square, which is press-adhered to one surface of a glass cloth substrate epoxy resin double-side copper-clad laminate (copper foil thickness of 3 μm and substrate thickness of 0.15 mm), is cured at 190° C. for 90 minutes, the warp can be preferably less than 3 cm, and more preferably less than 2 cm, while especially preferably less than 1 cm.

The cured product of the resin composition according to the present invention has a superior insulation reliability; and thus, the resistivity value measured with the condition of Test Example 1 to be described later can be preferably $1.0\times10^{10}$ Ω or more, more preferably $1.0\times10^{7}$ Ω or more, and still more preferably $1.0\times10^{5}$ Ω or more, while especially preferably $1.0\times10^{5}$ Ω or more.

The cured product of the resin composition according to the present invention has a superior adhesion property; thus, the peel strength (pre-HAST copper foil peel strength) can be preferably 0.50 kgf/cm or more, more preferably 0.55 kgf/cm or more, and still more preferably 0.60 kgf/cm or more, while especially preferably 0.65 kgf/cm or more. Here, this peel strength is measured as follows. After a resin composition layer that is press-adhered onto a roughened surface of copper foil (Ra value of 1 μm) under the condition of 100° C. and 0.74 MPa for 30 seconds is cured at 190° C. for 90 minutes to make a cured product layer thereof, the copper foil is peeled off from the cured product layer to a vertical direction by 35 mm at the rate of 50 mm/minute to obtain the peel strength.

Furthermore, the peel strength (post-HAST copper foil peel strength) can be preferably 0.20 kgf/cm or more, more preferably 0.30 kgf/cm or more, and still more preferably 0.35 kgf/cm or more, while especially preferably 0.40 kgf/cm or more. Here, this peel strength is measured as follows. A resin composition layer that is press-adhered onto a roughened surface of copper foil (Ra value of 1 μm) under the condition of 100° C. and 0.74 MPa for 30 seconds is cured at 190° C. for 90 minutes to make a cured product layer thereof; and then, after this is kept under the condition of 130° C., the relative humidity of 85%, and the direct current voltage of 3.3V for 200 hours, the copper foil is peeled off from the cured product layer to a vertical direction by 35 mm at the rate of 50 mm/minute to obtain the peel strength.

Furthermore, the peel strength (plating peel strength) measured as described below can be preferably 0.20 kgf/cm or more, more preferably 0.30 kgf/cm or more, and still more preferably 0.40 kgf/cm or more, while especially preferably 0.45 kgf/cm or more. Here, this peel strength is measured as follows. The cured product layer obtained by curing the resin composition according to the present invention under the curing condition of 130° C. for 30 minutes and 170° C. for 30 minutes is roughened under the condition of Test Example 4 to be described later; and then, after a conductive layer having the thickness of 20 m is formed by a semi-additive method, the conductive layer is peeled off from the cured product layer to a vertical direction by 35 mm at the rate of 50 mm/minute to obtain the peel strength.

The cured product of the resin composition according to the present invention has a superior formability of a via hole having a small diameter; and thus, a ratio of a top area and a bottom area (bottom area/top area) of the via hole formed in the cured product layer after the roughening treatment under the condition of Test Example 5 can be preferably 50% or more, while especially preferably 60% or more. The upper limit of the ratio of the top are and the bottom area is not particularly restricted, and it can be 100%, 98%, 95%, 90%, or the like.

Use of the Resin Composition

The resin composition according to the present invention can be suitably used as the resin composition for an insulation use, especially as the resin composition to form an insulating layer. Specifically, this can be suitably used as the resin composition to form an insulating layer on which a conductive layer (including a rewiring layer) is to be formed (resin composition for forming of an insulating layer to form a conductive layer). In addition, this can be suitably used as the resin composition to form an insulating layer of a printed wiring board to be described later (resin composition for forming of an insulating layer of a printed wiring board). In addition, the resin composition according to the present invention may be widely used in the use fields requiring a resin composition, such fields as a resin sheet, a sheet-like laminate material such as a prepreg, a solder resist, a under filler, a die bonding material, a semiconductor sealing material, a hole-filling resin, and a component-burying resin.

For example, in the case that a semiconductor chip package is produced by way of the following processes (1) to (6), the resin composition according to the present invention may also be suitably used as the resin composition for forming of a rewiring forming layer, for forming of an insulating layer to form the rewiring layer (a resin composition for forming of a rewiring forming layer), and for sealing of a semiconductor chip (a resin composition for sealing of a semiconductor chip). When a semiconductor chip package is produced, a rewiring layer may be further formed on a sealing layer.

(1) Process to laminate a temporarily fixed film on a substrate, (2) process to temporarily fix a semiconductor chip onto the temporarily fixed film, (3) process to form a sealing layer on the semiconductor chip, (4) process to remove the substrate and the temporarily fixed film from the semiconductor chip, (5) process to form a rewiring forming layer as an insulating layer on a surface from which the substrate of the semiconductor chip and the temporarily fixed film have been removed, and (6) process to form a rewiring layer as a conductive layer on the rewiring forming layer.

The resin composition according to the present invention can form an insulating layer that is superior in the component-burying property, so that this can be suitably used also in the case where a printed wiring board is a component-incorporated circuit board.

Sheet-Like Laminate Material

Although the resin composition according to the present invention may also be used in a varnish state so as to be applied, industrially, in general, it is preferable to use this in the form of a sheet-like laminate material containing the resin composition.

The sheet-like laminate material is preferably a resin sheet and a prepreg as described below.

In one embodiment, the resin sheet is formed of a support and a resin composition layer formed on the support, in which the resin composition layer is formed of the resin composition according to the present invention.

In view of the thinning of a printed wiring board, and providing a cured product having a superior insulating property even if the cured product of this resin composition is a thin film, the thickness of the resin composition layer is preferably 50 μm or less, while more preferably 40 μm or less. The lower limit of the thickness of the resin composition layer is not particularly restricted, and it can be usually 5 μm or more, 10 μm or more, or the like.

Illustrative examples of the support include a film formed of a plastic material, metal foil, and a releasing paper. Among them, a film formed of a plastic material and metal foil are preferable.

In the case that the film formed of a plastic material is used as the support, illustrative examples of the plastic material include polyesters such as polyethylene terephthalate (hereinafter, this is also simply called "PET"), and polyethylene naphthalate (hereinafter, this is also simply called "PEN"); polycarbonate (hereinafter, this is also simply called "PC"); acryls such as polymethyl methacrylate (PMMA); a cyclic polyolefin; triacetyl cellulose (TAC); polyether sulfide (PES); polyether ketone; and polyimide. Among them, polyethylene terephthalate and polyethylene naphthalate are preferable, while inexpensive polyethylene terephthalate is especially preferable.

In the case that metal foil is used as the support, illustrative examples of the metal foil include copper foil and aluminum foil, and copper foil is preferable. As to the copper foil, the foil formed of a copper single metal or an alloy of copper with other metal (for example, tin, chromium, silver, magnesium, nickel, zirconium, silicon, titanium, and the like) may be used.

The support may be subjected to a mat treatment, a corona treatment, or an antistatic treatment on the surface to be bonded with the resin composition layer.

As to the support, a releasing layer-attached support having a releasing layer on the surface to be bonded with the resin composition layer may be used. The releasing agent to be used in the releasing layer of the releasing layer-attached support may be one or more releasing agents selected from the group consisting of, for example, an alkyd resin, a polyolefin resin, a urethane resin, and a silicone resin. A commercially available good may also be used as the releasing layer-attached support. Illustrative examples thereof include a PET film having a releasing layer mainly formed of an alkyd resin type releasing agent, such as "SK-1", "AL-5", and "AL-7" (these are manufactured by Lintech Corp.); "Lumirror T60" (manufactured by Toray Industries); "Purex" (manufactured by Teijin Ltd.); and "Unipeel" (manufactured by Unitika Ltd.).

The thickness of the support is not particularly restricted, and it is preferably in the range of 5 to 75 μm, while more preferably in the range of 10 to 60 μm. When the releasing layer-attached support is used, total thickness of the releasing layer-attached support is preferably within this range.

In one embodiment, the resin sheet may further include an arbitrary layer, if necessary. The arbitrary layer may be, for example, among others, a protection film or the like, which is similar to the support, formed on the surface of the resin composition layer not bonded with the support (namely, the surface opposite to the support). The thickness of the protection film is not particularly restricted, and it is, for example, in the range of 1 to 40 μm. By providing the protection film, the resin composition layer may be prevented from attachment of dirt and the like as well as from a scar on the surface thereof.

The resin sheet may be produced, for example, as follows. The resin composition in a liquid state as it is, or a resin varnish prepared by dissolving the resin composition into an organic solvent is applied onto a support by means of a die coater or the like; and then, this is dried to form the resin composition layer.

Organic solvents the same as those explained as the component in the resin composition may be used. These organic solvents may be used singly or as a combination of two or more of them.

Drying may be carried out by a heretofore known method such as heating, and blowing of a hot air. The drying condition is not particularly restricted. Drying is carried out so as to bring the content of the organic solvent in the resin composition layer to 10% by mass or less, while preferably to 5% by mass or less. In the case that the resin composition containing an organic solvent with the amount, for example, in the range of 30 to 60% by mass, or the resin varnish containing an organic solvent with the same amount is used, the resin composition layer may be formed by drying thereof at 50 to 150° C. for 3 to 10 minutes, although these conditions are different depending on the boiling point of the organic solvent contained in the resin composition or in the resin varnish.

The resin sheet can be rolled up so as to be stored. In the case that the resin sheet has the protection film, the resin sheet can be used after the protection film is removed.

In one embodiment, a prepreg is formed by impregnating a sheet-like fibrous substrate with the resin composition according to the present invention.

The sheet-like fibrous substrate to be used in the prepreg is not particularly restricted. Those usually used as the substrate for a prepreg, such as a glass cloth, an aramid unwoven cloth, and a liquid crystal polymer unwoven cloth may be used. In view of the thinning of a printed wiring board, the thickness of the sheet-like fibrous substrate is preferably 50 µm or less, more preferably 40 µm or less, and still more preferably 30 µm or less, while especially preferably 20 µm or less. The lower limit of the thickness of the sheet-like fibrous substrate is not particularly restricted. Usually, the thickness thereof is 10 µm or more.

The prepreg may be produced by a heretofore known method such as a hot melt method, and a solvent method.

The thickness of the prepreg can be made within the same range as that of the resin composition layer in the resin sheet.

The sheet-like laminate material according to the present invention may be preferably used to form an insulating layer in a printed wiring board (a material for an insulating layer in a printed wiring board), while more preferably to form an interlayer insulating layer in a printed wiring board (a material for an interlayer insulating layer in a printed wiring board).

Printed Wiring Board

The printed wiring board according to the present invention includes an insulating layer formed of a cured product obtained by curing the resin composition according to the present invention.

The printed wiring board may be produced, for example, by using the resin sheet described above by a method including following processes (I) and (II):

(I) process to laminate a resin sheet on an inner layer substrate so as to bond a resin composition layer of the resin sheet with the inner layer substrate, and (II) process to cure the resin composition layer (for example, thermal cure) thereby forming an insulating layer.

"Inner layer substrate" used in the process (I) is a component to become a substrate of a printed wiring board; and illustrative examples thereof include a glass epoxy substrate, a metal substrate, a polyester substrate, a polyimide substrate, a BT resin substrate, and a thermosetting polyphenylene ether substrate. This substrate may have a conductive layer on one side or both sides thereof; and this conductive layer may be pattern-processed. The inner layer substrate having a conductive layer (circuit) on one side or both sides of the substrate is also called "inner layer circuit substrate". An intermediate product with which an insulating layer and/or a conductive layer is to be formed at the time of producing a printed wiring board is also included in the "inner layer substrate" according to the present invention. When the printed wiring board is a component-incorporated circuit board, an inner substrate incorporated with the component may be used.

Lamination of the resin sheet to the inner layer substrate may be carried out, for example, by hot-press adhesion of the resin sheet to the inner layer substrate from the support side thereof. Illustrative examples of the component for hot-press adhesion of the resin sheet to the inner layer substrate (hereinafter, this component is also called "hot-pressing component") include a heated metal plate (a SUS mirror plate and the like) and a heated metal roll (a SUS roll). At this time, it is preferable that the resin sheet is pressed not directly by the hot-pressing component but via an elastic material such as a heat-resistant rubber so that the resin sheet may sufficiently follow the surface irregularity of the inner layer substrate.

Lamination of the resin sheet to the inner layer substrate may be carried out by a vacuum lamination method. In the vacuum lamination method, the temperature of the hot-press adhesion is preferably in the range of 60 to 160° C., while more preferably in the range of 80 to 140° C. The pressure of the hot-press adhesion is preferably in the range of 0.098 to 1.77 MPa, while more preferably in the range of 0.29 to 1.47 MPa. The period of the hot-press adhesion is preferably in the range of 20 to 400 seconds, while more preferably in the range of 30 to 300 seconds. The lamination can be carried out under evacuated condition of preferably 26.7 hPa or less of the pressure.

Lamination may be carried out by using a commercially available vacuum laminator. Illustrative examples of the commercially available vacuum laminator include a vacuum pressure type laminator manufactured by Meiki Co., Ltd., and a vacuum applicator and a batch type vacuum pressure laminator, both being manufactured by Nikko-Materials Co., Ltd.

After the lamination, for example, the laminated resin sheet may be flattened by pressing the hot-pressing component from the side of the support thereof under a normal pressure (under an atmospheric pressure). The pressing conditions of the flattening process can be made as same as the hot-press adhesion conditions in the before-mentioned lamination. The flattening process may be carried out by using a commercially available laminator. The lamination and the flattening processes may be carried out continuously by using the commercially available vacuum laminator described above.

The support may be removed between the process (I) and the process (II), or after the process (II).

In the process (II), the resin composition layer is cured (for example, thermally cured) to form an insulating layer formed of a cured product of the resin composition. Curing conditions of the resin composition layer are not particularly restricted, so that the conditions usually used to form an insulating layer of a printed wiring board may be used.

Thermosetting conditions of the resin composition layer are different depending on the resin composition and the like. For example, the curing temperature is preferably in the range of 120 to 240° C., and more preferably in the range of 150 to 220° C., while still more preferably in the range of 170 to 210° C. The curing period can be preferably in the range of 5 to 120 minutes, and more preferably in the range of 10 to 100 minutes, while still more preferably in the range of 15 to 100 minutes.

Before the resin composition layer is thermally cured, the resin composition layer may be pre-heated at the temperature lower than the curing temperature. For example, prior to thermosetting of the resin composition layer, the resin composition layer may be pre-heated in the temperature range of 50 to 120° C., and preferably in the range of 60 to 115° C., while more preferably in the range of 70 to 110° C., and for the period of 5 minutes or longer, preferably in the range of 5 to 150 minutes, and more preferably in the range of 15 to 120 minutes, while still more preferably in the range of 15 to 100 minutes.

In production of the printed wiring board, a process (III) to make a hole in the insulating layer, a process (IV) to roughen the insulating layer, and a process (V) to form a conductive layer may be further carried out. The processes from (III) to (V) may be carried out in accordance with various methods heretofore known to a person ordinarily skilled in the art in production of a printed wiring board. In the case that the support is removed after the process (II), removal of the support may be carried out between the process (II) and the process (III), or between the process (III) and the process (IV), or between the process (IV) and the process (V). As needed, processes (II) to (V), i.e., formation of the insulating layer and the conductive layer, may be repeated to form a multilayer wiring board.

In other embodiment, the printed wiring board according to the present invention may be produced by using the above-mentioned prepreg. The production method thereof is basically the same as the production method by using the resin sheet.

In the process (III), a hole is created in the insulating layer. With this, a hole such as a via hole, and a through hole can be formed in the insulating layer. The process (III) may be carried out by using, for example, a drill, a laser, a plasma, or the like in accordance with composition and the like of the resin composition used to form the insulating layer. The size and shape of the hole may be arbitrarily determined in accordance with a design of the printed wiring board.

In the process (IV), the insulating layer is roughened. Usually, in the process (IV), a smear is removed as well. The procedure and condition of the roughening process are not particularly restricted, so that heretofore known procedure and condition usually used to form an insulating layer of a printed wiring board can be used. The roughening process of the insulating layer may be carried out, for example, by a method in which a swelling treatment with a swelling liquid, a roughening treatment with an oxidant, and a neutralizing treatment with a neutralizing solution are carried out in this order.

The swelling liquid to be used in the roughening process is not particularly restricted, and illustrative examples of the swelling liquid include an alkaline solution and a surfactant solution. Among them, an alkaline solution is preferable, while a sodium hydroxide solution and a potassium hydroxide solution are more preferable as the alkaline solution. Illustrative examples of the swelling liquid that is commercially available include "Swelling Dip Securiganth P" and "Swelling Dip Securiganth SBU" (both are manufactured by Atotech Japan Co., Ltd.). The swelling treatment with the swelling liquid is not particularly restricted, and for example, can be carried out by soaking the insulating layer into the swelling liquid in the temperature range of 30 to 90° C. and for the period of 1 to 20 minutes. In view of suppressing the swelling of the resin in the insulating layer to a suitable level, it is preferable to soak the insulating layer into the swelling liquid in the temperature range of 40 to 80° C. and for the period of 5 to 15 minutes.

Oxidant to be used in the roughening process is not particularly restricted, and illustrative examples of the oxidant include an alkaline permanganate solution having potassium permanganate or sodium permanganate dissolved into a sodium hydroxide aqueous solution. The roughening process with an oxidant such as the alkaline permanganate solution may be carried out preferably by soaking the insulating layer into the oxidant solution heated to 60 to 100° C. for the period of 10 to 30 minutes. The concentration of the permanganate salt in the alkaline permanganate solution is preferably in the range of 5 to 10% by mass. Illustrative examples of the oxidant that is commercially available include alkaline permanganate solutions such as "Concentrate Compact CP", and "Dosing Solution Securiganth P" (both are manufactured by Atotech Japan, Co., Ltd.).

The neutralization solution to be used in the roughening process is preferably an acidic aqueous solution, and illustrative examples of the commercially available neutralization solution include "Reduction Solution Securiganth P" (manufactured by Atotech Japan Co., Ltd.).

Treatment with the neutralization solution can be carried out by soaking the surface treated with the roughening process by using the oxidant into the neutralization solution in the temperature range of 30 to 80° C. for the period of 5 to 30 minutes. In view of workability, it is preferable to soak the object treated with the roughening process by using the oxidant into the neutralization solution in the temperature range of 40 to 70° C. for the period of 5 to 20 minutes.

In one embodiment, the arithmetic average roughness (Ra) of the surface of the insulating layer after the roughening process is not particularly restricted, and it is preferably 500 nm or less, and more preferably 400 nm or less, while still more preferably 300 nm or less. The lower limit thereof is not particularly restricted, and it can be, for example, 1 nm or more, or 2 nm or more, or the like. The root mean square roughness (Rq) of the surface of the insulating layer after the roughening process is preferably 500 nm or less, and more preferably 400 nm or less, while still more preferably 300 nm or less. The lower limit thereof is not particularly restricted, and it can be, for example, 1 nm or more, or 2 nm or more, or the like. The arithmetic average roughness (Ra) and the root mean square roughness (Rq) of the surface of the insulating layer can be measured by using a non-contact type surface roughness meter.

In the process (V), a conductive layer is formed; the conductive layer is formed on the insulating layer. There is no particular restriction in the conductive material to be used in the conductive layer. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or a metal alloy layer. Illustrative examples of the metal alloy layer include layers formed of metal alloys of two or more metals selected from the group mentioned above (for example, nickel-chromium alloy, copper-nickel alloy, and copper-titanium alloy). Among them, in view of general applicability to formation of the conductive layer, cost, easy patterning, and the like, preferable are single metal layers of chromium, nickel, titanium, aluminum, zinc, gold, palladium, silver, or copper; and metal alloy layers of a nickel-chromium alloy, a copper-nickel alloy, and a copper-titanium alloy. Among them, more preferable are single metal layers of chromium, nickel, titanium, aluminum, zinc, gold, palladium, silver, or copper, or a metal alloy layer of a nickel-chromium alloy. A single metal layer of copper is still more preferable.

The conductive layer may be of a single layer structure or of a multiple layer structure that includes two or more laminated single metal layers or metal alloy layers formed of different metals or metal alloys. In the case that the conductive layer is of the multiple layer structure, the layer contacting with the insulating layer is preferably a single metal layer of chromium, zinc, or titanium, or a metal alloy layer of a nickel-chromium alloy.

The thickness of the conductive layer is generally in the range of 3 to 35 μm, while preferably in the range of 5 to 30 although these values depend on the intended design of the printed wiring board.

In one embodiment, the conductive layer may be formed by plating. For example, the conductive layer having an intended wiring pattern may be formed by plating on the surface of the insulating layer by a conventional heretofore known technology such as a semi-additive method, and a full additive method. In view of convenience in the production thereof, it is preferable to form the conductive layer by a semi-additive method. Hereinafter, an example will be described in which the conductive layer is formed by a semi-additive method.

First, a plated seed layer is formed onto the surface of the insulating layer by electroless plating. Next, onto the plated seed layer thus formed, a mask pattern is formed so as to expose part of the plated seed layer in accordance with an intended wiring pattern. After a metal layer is formed by electroplating onto the plated seed layer thus exposed, the mask pattern is removed. Thereafter, an unnecessary plated seed layer is removed by etching or the like, so that the conductive layer having the intended wiring pattern can be formed.

In an alternative embodiment, the conductive layer may be formed by using metal foil. In the case that the conductive layer is formed by using metal foil, it is preferable to carry out the process (V) between the process (I) and the process (II). For example, after the process (I), the support is removed; and the metal foil is laminated on the surface of the resin composition layer thus exposed. Lamination of the metal foil with the resin composition layer may be carried out by a vacuum lamination method. The lamination conditions may be the same as those explained in the process (I). Next, the process (II) is carried out to form the insulating layer. Thereafter, by utilizing the metal foil on the insulating layer, the conductive layer having an intended wiring pattern can be formed by a conventional heretofore known technology such as a subtractive method, and a modified semi-additive method.

The metal foil may be produced by a heretofore known method such as an electrolysis method, and a rolling method. Illustrative examples of the metal foil that is commercially available include: HLP foil and JXUT-III foil (both are manufactured by JX Nippon Mining & Metals Corp.); and 3EC-III foil and TP-III foil (both are manufactured by Mitsui Mining & Smelting Co., Ltd.).

Semiconductor Device

The semiconductor device according to the present invention includes the printed wiring board according to the present invention. The semiconductor device according to the present invention can be produced by using the printed wiring board according to the present invention.

The semiconductor device may be various semiconductor devices to be supplied to electric products (for example, a computer, a mobile phone, a digital camera, and a television), vehicles (for example, a motor bike, an automobile, an electric train, a marine ship, and an airplane), and the like.

EXAMPLES

Hereinafter, the present invention will be explained specifically by means of Examples. It must be noted here that the present invention is not limited to these Examples. In the explanation below, "parts" and "%" that are used to express quantities mean "parts by mass" and "% by mass", respectively, unless otherwise specifically mentioned.

Measurement of Average Particle Diameter of Inorganic Filler

Into a vial bottle, 100 mg of an inorganic filler, 0.1 g of a surfactant ("SN9228": manufactured by San Nopco Ltd.), and 10 g of methyl ethyl ketone were weighed; and then, the resulting mixture was dispersed by mean of an ultrasonic wave for 20 minutes. A particle diameter distribution thereof was measured with a batch cell method using a laser diffraction type particle diameter distribution measurement apparatus ("SALD-2200": manufactured by Shimadzu Corp.); and then, the average particle diameter expressed by the median diameter was calculated.

Measurement of Average Particle Diameter of Rubber Particles

The average particle diameter of the rubber particles can be measured by using a dynamic light scattering method. Specifically, rubber particles were uniformly dispersed in a suitable organic solvent by means of an ultrasonic wave or the like; and then, a particle diameter distribution of the rubber particles on the mass basis was prepared by means of a fiber-optics particle analyzer (FPAR-1000: manufactured by Otsuka Electronics Co., Ltd.). The median diameter thereof was measured as the average particle diameter of the rubber particles.

Synthesis Example 1

In a reaction vessel, 69 g of a bifunctional polybutadiene terminated with a hydroxy group (G-1000: manufactured by Nippon Soda Co., Ltd.; number-average molecular weight of 1,000; hydroxy equivalent of 1,800 g/eq.), 40 g of Ipsole 150 (aromatic hydrocarbon-based mixed solvent: manufactured by Idemitsu Petrochemical Co., Ltd.), and 0.005 g of dibutyltin laurate were mixed, and then, the mixture was uniformly dissolved. When the resulting mixture became uniform, the temperature thereof was raised to 50° C.; and then, with further stirring, after 8 g of isophorone diisocyanate (IPDI: manufactured by Evonik Degussa Japan Co., Ltd.; isocyanate equivalent of 113 g/eq.) was added thereinto, the reaction was carried out for about 3 hours. Next, after the reaction mixture was cooled to room temperature, 23 g of a cresol novolak resin (KA-1160: manufactured by DIC Corp.; hydroxy equivalent of 117 g/eq.) and 60 g of ethyl diglycol acetate (manufactured by Daicel Corp.) were added to this mixture; and then, with stirring, the temperature of the resulting mixture was raised to 80° C. The reaction was carried out for about 4 hours. Disappearance of the NCO peak at 2,250 cm$^{-1}$ was confirmed by means of an FT-IR. It was judged that the reaction was completed by confirmation of disappearance of the NCO peak. After the reaction mixture was cooled to room temperature, the reaction mixture was filtrated by a 100-mesh filter cloth to obtain a liquid polybutadiene resin having a phenolic hydroxy group (non-volatile portion of 50% by mass). The number-average molecular weight thereof was 4,500.

Synthesis Example 2

In a reaction vessel, 69 g of a bifunctional polybutadiene terminated with a hydroxy group (G-2000: manufactured by Nippon Soda Co., Ltd.; number-average molecular weight of 3,000; hydroxy equivalent of 1,800 g/eq.), 40 g of Ipsole 150 (an aromatic hydrocarbon-based mixed solvent: manufactured by Idemitsu Petrochemical Co., Ltd.), and 0.005 g of dibutyltin laurate were mixed, and then, they were uniformly dissolved. When the resulting mixture became uniform, the temperature thereof was raised to 50° C.; and then, with further stirring, after 8 g of isophorone diisocyanate (IPDI: manufactured by Evonik Degussa Japan Co., Ltd.; isocyanate equivalent of 113 g/eq.) was added thereinto, the reaction was carried out for about 3 hours. Next, after the reaction mixture was cooled to room temperature, 23 g of a cresol novolak resin ("KA-1160": manufactured by DIC Corp.; hydroxy equivalent of 117 g/eq.) and 60 g of ethyl diglycol acetate (manufactured by Daicel Corp.) were added to this mixture; and then, with stirring, the temperature of the resulting mixture was raised to 80° C. The reaction was carried out for about 4 hours. Disappearance of the NCO peak at 2,250 cm$^{-1}$ was confirmed by means of an FT-IR. It was judged that the reaction was completed by confirmation of disappearance of the NCO peak. After the reaction mixture was cooled to room temperature, the reaction mixture was filtrated by a 100-mesh filter cloth to obtain a liquid polybutadiene resin having a phenolic hydroxy group (non-volatile portion of 50% by mass). The number-average molecular weight thereof was 5,500.

Example 1

Into 60 parts of MEK, 10 parts of a bisphenol A epoxy resin ("828US": manufactured by Mitsubishi Chemical Corp.; epoxy equivalent of about 180 g/eq.), 10 parts of a naphthalene epoxy resin ("HP-4032SS": manufactured by DIC Corp.; epoxy equivalent of about 140 g/eq.), 20 parts of a biphenyl epoxy resin ("NC3000L": manufactured by Nippon Kayaku Co., Ltd.; epoxy equivalent of about 269 g/eq.), 20 parts of a biphenyl epoxy resin ("YX4000H": manufactured by Mitsubishi Chemical Corp.; epoxy equivalent of about 190 g/eq.), 3 parts of a phosphazene resin ("PX-200": manufactured by Otsuka Chemical Co., Ld.), 10 parts of a phenoxy resin ("YX7553BH30": manufactured by Mitsubishi Chemical Corp.; 30% by mass of solid portion in a 1:1 mixed solution of MEK and cyclohexanone), and 28 parts of urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane) were dissolved by heating with stirring.

After the resulting solution was cooled to room temperature, into this solution were added 70 parts of an active ester type curing agent ("HPC-8000-65T": manufactured by DIC Corp.; active group equivalent of about 223 g/eq.; a toluene solution with 65% by mass of solid portion), 6 parts of a phenol type curing agent ("LA-3018-50P": manufactured by DIC Corp.; active group equivalent of about 151 g/eq.; a 2-methoxypropanol solution with 50% by mass of solid portion), 18 parts of a carbodiimide type curing agent ("V-03": manufactured by Nisshinbo Chemical, Inc.; active group equivalent of about 216 g/eq.; a toluene solution with 50% by mass of solid portion), 6 parts of a curing accelerator (4-dimethylaminopyridine (DMAP): an MEK solution with 5% by mass of solid portion), and 300 parts of spherical silica ("UFP-20": manufactured by Denka Co., Ltd.; specific surface area of 22 m$^2$/g: average particle diameter of 0.15 μm) surface-modified with N-phenyl-8-aminooctylt-rimethoxysilane (molecular weight of 325.2: manufactured by Shin-Etsu Chemical Co., Ltd.). The resulting mixture was uniformly dispersed with a high speed rotation mixer, and then filtrated with a cartridge filter ("SHP020": manufactured by Roki Techno Co., Ltd.) to obtain a resin composition.

Example 2

A resin composition was prepared in the same way as Example 1 except that 28 parts of the urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane) was changed to 8.5 parts of a liquid polybutadiene resin having an epoxy group ("JP-100": manufactured by Nippon Soda Co., Ltd.; epoxy equivalent of about 210 g/eq.).

Example 3

A resin composition was prepared in the same way as Example 1 except that the amount of the spherical silica ("UFP-20": manufactured by Denka Co., Ltd.; specific surface area of 22 m$^2$/g; average particle diameter of 0.15 μm) surface-modified with N-phenyl-8-aminooctylt-rimethoxysilane (molecular weight of 325.2; manufactured by Shin-Etsu Chemical Co., Ltd.) was changed from 300 parts to 110 parts.

Example 4

A resin composition was prepared in the same way as Example 1 except that 28 parts of the urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane), was changed to 17 parts of the liquid polybutadiene resin having a phenolic hydroxy group (solid portion of 50% by mass; number-average molecular weight of 4,500) obtained in Synthesis Example 1.

Example 5

A resin composition was prepared in the same way as Example 1 except that 28 parts of the urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane) was changed to 17 parts of the liquid polybutadiene resin having a phenolic hydroxy group (solid portion of 50% by mass; number-average molecular weight of 5,500) obtained in Synthesis Example 2.

Example 6

A resin composition was prepared in the same way as Example 1 except that 28 parts of the urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane) was changed to 80 parts of the liquid polybutadiene resin having a phenolic hydroxy group (solid portion of 50% by mass; number-average molecular weight of 4,500) obtained in Synthesis Example 1.

Example 7

A resin composition was prepared in the same way as Example 1 except that 28 parts of the urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane) was changed to 8.5 parts of the liquid polybutadiene resin having an epoxy group ("JP-100": manufactured by Nippon Soda Co., Ltd.; epoxy equivalent of about 210 g/eq.), and 70 parts of the active ester type curing agent ("HPC-8000-65T": manufactured by DIC Corp.; active group equivalent of about 223 g/eq.; a toluene solution with 65% by mass of solid portion) was changed to 65 parts of an active ester type curing agent ("HPC-8150-60T": manufactured by DIC Corp.; active group equivalent of about 220 g/eq.; a toluene solution with 60% by mass of solid portion).

Comparative Example 1

A resin composition was prepared in the same way as Example 1 except that 28 parts of the urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane) was changed to 28 parts of rubber particles ("MM-110SM": manufactured by Negami Chemical Industrial Co., Ltd.; average particle diameter of 1 μm; 30% by mass of solid portion in a 4:1 mixed solution of MEK and cyclohexanone); and 300 parts of the spherical silica ("UFP-20": manufactured by Denka Co., Ltd.; specific surface area of 22 m²/g; average particle diameter of 0.15 him) surface-modified with N-phenyl-8-aminooctyltrimethoxysilane (molecular weight of 325.2; manufactured by Shin-Etsu Chemical Co., Ltd.) was changed to 300 parts of spherical silica ("SC2050-SXF": manufactured by Admatechs Co., Ltd.; specific surface area of 5.9 m²/g; average particle diameter of 0.77 μm) surface-modified with N-phenyl-8-aminooctyltrimethoxysilane (molecular weight of 325.2; manufactured by Shin-Etsu Chemical Co., Ltd.).

Comparative Example 2

A resin composition was prepared in the same way as Example 1 except that 300 parts of the spherical silica ("UFP-20": manufactured by Denka Co., Ltd.; specific surface area of 22 m²/g; average particle diameter of 0.15 μm) surface-modified with N-phenyl-8-aminooctyltrimethoxysilane (molecular weight of 325.2; manufactured by Shin-Etsu Chemical Co., Ltd.) was changed to 300 parts of spherical silica ("SC2050-SXF": manufactured by Admatechs Co., Ltd.; specific surface area of 5.9 m²/g; average particle diameter of 0.77 μm) surface-modified with N-phenyl-8-aminooctyltrimethoxysilane (molecular weight of 325.2; manufactured by Shin-Etsu Chemical Co., Ltd.).

Comparative Example 3

A resin composition was prepared in the same way as Example 1 except that 28 parts of the urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane) was changed to 28 parts of rubber particles ("MM-110SM": manufactured by Negami Chemical Industrial Co., Ltd.; average particle diameter of 1 μm; 30% by mass of solid portion in a 4:1 mixed solution of MEK and cyclohexanone).

Comparative Example 4

A resin composition was prepared in the same way as Example 1 except that 28 parts of the urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane) was not used.

Comparative Example 5

A resin composition was prepared in the same way as Example 1 except that 28 parts of the urethane rubber particles ("MM-101SM": manufactured by Negami Chemical Industrial Co., Ltd.; average particle diameter of 0.07 to 0.10 μm; 30% by mass of solid portion in a 4:1 mixed solution of MEK and cyclohexane) was changed to 160 parts of the liquid polybutadiene resin having a phenolic hydroxy group (solid portion of 50% by mass: number-average molecular weight of 4,500) obtained in Synthesis Example 1.

Preparation Example 1: Preparation of Resin Sheet A

A PET film ("Lumirror R80": manufactured by Toray Industries; thickness of 38 μm; softening temperature of 130° C.) releasing-treated with an alkyd resin type releasing agent ("AL-5": manufactured by Lintech Corp.) was prepared as a support (hereinafter, this is also called "releasing PET").

Each of the resin compositions prepared in Examples or Comparative Examples was applied uniformly onto the releasing PET by means of a die coater so as to make the thickness of a resin composition layer after drying 6 μm. This was dried at 80° C. for 1 minute to obtain the resin composition layer formed on the releasing PET. Next, a polypropylene film ("ALPHAN MA-411": manufactured by Oji F-Tex Co., Ltd.; thickness of 15 μm) as a protection film was laminated so as to bond a rough surface thereof with a surface of the resin composition layer not bonded with the support. By so doing, "Resin Sheet A" formed of the releasing PET (support), the resin composition layer, and the protection film in this order was prepared.

Preparation Example 2: Preparation of Resin Sheet B

A PET film ("Lumirror R80": manufactured by Toray Industries; thickness of 38 μm; softening temperature of 130° C.) releasing-treated with an alkyd resin type releasing agent ("AL-5": manufactured by Lintech Corp.) was prepared as a support (hereinafter, this is also called "releasing PET").

Each of the resin compositions prepared in Examples or Comparative Examples was applied uniformly onto the releasing PET by means of a die coater so as to make the thickness of a resin composition layer after drying 10 m. This was dried at 80° C. for 2 minutes to obtain the resin composition layer formed on the releasing PET. Next, a polypropylene film ("ALPHAN MA-411": manufactured by Oji F-Tex Co., Ltd.; thickness of 15 μm) as a protection film was laminated so as to bond a rough surface thereof with a surface of the resin composition layer not bonded with the support. By so doing, "Resin Sheet B" formed of the releasing PET (support), the resin composition layer, and the protection film in this order was prepared.

Preparation Example 3: Preparation of Resin Sheet C

A PET film ("Lumirror R80": manufactured by Toray Industries; thickness of 38 μm; softening temperature of 130° C.) releasing-treated with an alkyd resin type releasing agent ("AL-5": manufactured by Lintech Corp.) was prepared as a support (hereinafter, this is also called "releasing PET").

Each of the resin compositions prepared in Examples or Comparative Examples was applied uniformly onto the releasing PET by means of a die coater so as to make the thickness of a resin composition layer after drying 15 μm. This was dried at 80° C. for 2 minute to obtain the resin composition layer formed on the releasing PET. Next, a polypropylene film ("ALPHAN MA-411": manufactured by Oji F-Tex Co., Ltd.; thickness of 15 μm) as a protection film was laminated so as to bond a rough surface thereof with a surface of the resin composition layer not bonded with the support. By so doing, "Resin Sheet C" formed of the releasing PET (support), the resin composition layer, and the protection film in this order was prepared.

Test Example 1: Evaluation of Insulation Reliability

Preparation of Substrate for Evaluation
(1) Surface Preparation of Inner Layer Circuit Substrate A glass cloth substrate epoxy resin double-side copper-clad laminate ("HL832NSF LCA": manufactured by Mitsubishi Gas Chemicals Co., Ltd.; copper foil's thickness of 3 μm; substrate's thickness of 0.15 mm; size of 255 mm×340 mm) having on both sides thereof a circuit conductor (copper) formed with a wiring pattern of L/S (line/space) of 2 μm/2 μm was prepared as an inner layer circuit substrate. Both surfaces (copper surfaces) of the inner layer circuit substrate were subjected to a treatment for organic filming with "FlatBOND-FT" (manufactured by MEC Co., Ltd.).

(2) Lamination of Resin Sheet

The protection film was removed from Resin Sheet A prepared in Preparation Example 1; and then, the resin composition layers were laminated on both surfaces of the inner layer circuit substrate so as to contact with the inner layer circuit substrate by using a batch type vacuum pressure laminator ("CVP700": two stage build up laminator; manufactured by Nikko-Materials Co., Ltd.). After the pressure was reduced for 30 seconds to 13 hPa or less, the lamination was carried out by press-adhering thereof at 130° C. with the pressure of 0.74 MPa for 45 seconds. Then, this was hot pressed at 120° C. with the pressure of 0.5 MPa for 75 seconds.

(3) Thermal Curing of the Resin Composition Layer

The inner layer circuit substrate having the resin sheet laminated was placed in an oven heated at 130° C., thermally cured for 30 minutes; and then, after being transferred to an oven heated at 170° C., further thermally cured for 30 minutes to obtain an insulating layer having the thickness of 5 μm; and then, the releasing PET was removed. This is designated as "Substrate A".

(4) Process to Carry Out Roughening Treatment

The insulating layer of the Substrate A was subjected to a desmear treatment as a roughening process. The desmear treatment was carried out with a wet desmear treatment as described below.

Wet Desmear Treatment:

The substrate was soaked in a swelling liquid ("Swelling Dip Securiganth P": manufactured by Atotech Japan Co., Ltd.; an aqueous solution of diethylene glycol monobutyl ether and sodium hydroxide) at 60° C. for 5 minutes. Next, the substrate was subsequently soaked in an oxidant solution ("Concentrate Compact CP": manufactured by Atotech Japan Co., Ltd.; aqueous solution containing potassium permanganate with concentration of about 6% and sodium hydroxide with concentration of about 4%) at 80° C. for 10 minutes. Finally, the substrate was soaked in a neutralization solution ("Reduction Solution Securiganth P": manufactured by Atotech Japan Co., Ltd.; aqueous sulfuric acid solution) at 40° C. for 5 minutes; and then, dried at 80° C. for 15 minutes. This is designated as "Roughened Substrate A".

(5) Process to Form Conductive Layer
(5-1) Electroless Plating Process

In order to form a conductive layer on the surface of the insulating layer of the Roughened Substrate A, the plating process including the processes 1 to 6 described below was carried out (copper plating process using chemical liquids manufactured by Atotech Japan Co., Ltd.).

1. Alkali Cleaning (cleaning and electric charge adjustment of the insulating layer surface formed with a via hole)

The surface of the Roughened Substrate A was cleaned at 60° C. for 5 minutes by using Cleaning Cleaner Securiganth 902 (trade name).

2. Soft Etching (cleaning of inside the via hole) The surface of the Roughened Substrate A was treated with a sulfuric acidic aqueous solution of sodium peroxobisulfate at 30° C. for 1 minute.

3. Pre-dip (adjustment of electric charge on the insulating layer surface so as to provide Pd)

The surface of the Roughened Substrate A was treated with Pre. Dip Neoganth B (trade name) at room temperature for 1 minute.

4. Provision of Activator (provision of Pd to the insulating layer surface)

The surface of the Roughened Substrate A was treated with Activator Neoganth 834 (trade name) at 35° C. for 5 minutes.

5. Reduction (reduction of Pd provided to the insulating layer)

The surface of the Roughened Substrate A was treated with a mixture of Reducer Neoganth WA (trade name) and Reducer Accelerator 810 mod. (trade name) at 30° C. for 5 minutes.

6. Electroless Copper Plating Process (to deposit Cu onto the insulating layer surface (Pd surface))

The surface of the Roughened Substrate A was treated at 35° C. for 20 minutes with a mixture solution of Basic Solution Printganth MSK-DK (trade name), Copper Solution Printganth MSK (trade name), Stabilizer Printganth MSK-DK (trade name), and Reducer Cu (trade name). The thickness of the electroless plated copper layer thus formed was 0.8 μm.

(5-2) Electroplating Process

Next, a copper electroplating process was carried out by using chemical liquids manufactured by Atotech Japan Co., Ltd. under the condition to fill inside the via hole with copper. Then, a conductive layer having a land and a conductive pattern with the thickness of 10 μm was formed on the insulating layer surface by using, as a resist pattern for patterning by etching, a land pattern with a diameter of 1 mm electrically connected to the via hole and a circular conductive pattern with a diameter of 10 mm unconnected to the lower conductive layer. Next, an anneal treatment thereof was carried out at 200° C. for 90 minutes. The substrate thus obtained was designated as "Evaluation Substrate".

Measurement of Thickness of the Insulating Layer

A cross section of the Evaluation Substrate was observed by using a FIB-SEM composite apparatus ("SMI3050SE": manufactured by SII Nanotechnology Inc.). Specifically, the section in a perpendicular direction to the conductive layer surface was scraped out by means of a focused ion beam (FIB); and from the SEM picture of the section, the thickness of the insulating layer between the conductive layers was measured. For each sample, the SEM picture of the section was observed at different 5 positions selected arbitrarily; and an average value thereof was taken as the thickness (μm) of the insulation layer between the conductive layers. These values are summarized in Table below.

Measurement of Resistance of the Insulating Layer

The insulating resistance value of the Evaluation Substrate obtained above after passage of 200 hours under the condition of 130° C., relative humidity of 85%, and the direct current voltage of 3.3 V in a highly accelerated life testing apparatus ("PM422": manufactured by ETAC Engineering Co., Ltd.) was measured by using an electrochemical migration tester ("ECM-100": manufactured by J-RAS Inc.), in which the side of the circular conductor with the diameter of 10 mm of the Evaluation Substrate was made to a positive electrode and the side of the lattice conductor (copper) of the inner layer circuit substrate connected to the land with a diameter of 1 mm was made to a negative electrode. This measurement was carried out 6 times. When the resistance values in all of the 6 test pieces were $1.0 \times 10^7 \Omega$ or more, this was expressed with the symbol "○"; and when even only one of them was less than $1.0 \times 10^7 \Omega$, this was expressed with the symbol "X". The evaluation results together with the insulation resistance values are summarized in Table below. The minimum resistance value described in Table 1 below is the minimum value of the insulation resistances of the 6 test pieces.

Test Example 2: Evaluation of Warp (1) Lamination of the Resin Composition Layer The Resin Sheet C prepared in Preparation Example 3 was cut out to the size of a 14 cm square; and then, the resin sheet C cut out was laminated, by using a batch type vacuum pressure laminator ("CVP700": two stage build up laminator; manufactured by Nikko-Materials Co., Ltd.), to one of the substrate surfaces of the glass cloth substrate epoxy resin double-side copper-clad laminate ("HL832NSF LCA": manufactured by Mitsubishi Gas Chemicals Co., Ltd.; copper foil's thickness of 3 μm; substrate's thickness of 0.15 mm; size of 255 mm×340 mm) having been cut out to a size of a 15 cm square.

After the pressure was reduced for 30 seconds to 13 hPa or less, the lamination was carried out by press-adhering thereof at 120° C. with the pressure of 0.74 MPa for 30 seconds to obtain a substrate attached with the resin composition layer; and then, the PET film was removed.

(2) Curing of the Resin Composition Layer

Four sides of the substrate attached with the resin composition layer obtained in (1) were adhered to a SUS plate having the thickness of 1 mm by means of a polyimide tape so as to make the resin composition layer on an upper side; and then, the resin composition layer was cured under the curing condition of 190° C. for 90 minutes.

(3) Measurement of Warp

Among four sides of the substrate attached with the resin composition layer obtained in (2), polyimide tapes of the three sides were removed. Then, the warp value was obtained from the height at the highest point from the SUS plate. When the warp value was less than 1 cm, this was expressed with the symbol "○"; when the warp amount was 1 cm or more and less than 3 cm, this was expressed with the symbol "Δ"; and when the warp amount was 3 cm or more, this was expressed with the symbol "X".

Test Example 3: Evaluation of Copper Foil

Adhesion Property (Peel Strength) (1) Surface Preparation of Copper Foil A glossy surface of the copper foil ("3EC-III (thickness of 35 μm)": manufactured by Mitsui Mining & Smelting Co., Ltd.) was soaked in MECetchBOND "CZ-8101" (manufactured by MEC Co., Ltd.) to carry out a roughening treatment on the copper surface (Ra value of 1 μm), followed by a rust prevention treatment (CL8300). This copper foil is called CZ Copper Foil. Then, the heat treatment was carried out in an oven heated at 130° C. for 30 minutes.

(2) Lamination of Copper Foil and Formation of Insulating Layer

The Resin Sheet B prepared in Preparation Example 2 was laminated on both surfaces of the inner layer circuit substrate so as to bond the resin composition layer with the inner layer circuit substrate by using a batch type vacuum pressure laminator ("CVP700": two stage build up laminator; manufactured by Nikko-Materials Co., Ltd.). After the pressure was reduced for 30 seconds to 13 hPa or less, the lamination was carried out by press-adhering thereof at 100° C. with the pressure of 0.74 MPa for 30 seconds. The PET film, i.e., the support was removed from the resin composition layer thus laminated. Onto this resin composition layer, the treated surface of CZ Copper Foil of "3EC-III" was laminated under the same condition as described above. Then, the resin composition layer was cured under the curing condition of 190° C. for 90 minutes to form an insulating layer. In such a way, a sample was prepared.

(3) Measurement of Copper Foil Peel Strength (Adhesion Property) before Accelerated Environmental Test (HAST)

The sample prepared as described above was cut to a small piece with a size of 150 mm×30 mm. In the copper foil portion in this small piece, a portion of a 10 mm width and a 100 mm length was incised by means of a cutter, and then, one edge of the copper foil was peeled off and held by a holding device ("AC-50C-SL": AutoCom tester; manufactured by T.S.E Co. Ltd.) to peel off toward a vertical direction at the rate of 50 mm/minute by using an Instron universal testing machine at room temperature. The load at the peeling off length of 35 mm was measured in accordance with JIS C6481 to obtain the pre-HAST peel strength (kgf/cm).

(4) Measurement of Copper Foil Peel Strength (Adhesion Property) after Accelerated Environmental Test (HAST)

The sample prepared as described above was placed in a highly accelerated life testing apparatus ("PM422": manufactured by ETAC Engineering Co., Ltd.) under the condition of 130° C., relative humidity of 85%, and the direct current voltage of 3.3 V for 200 hours. Then, one edge of the copper foil was peeled off and held by a holding device ("AC-50C-SL": AutoCom tester; manufactured by T.S.E Co. Ltd.) to peel off toward a vertical direction at the rate of 50 mm/minute by using an Instron universal testing machine at room temperature. The load at the peeling off length of 35 mm was measured in accordance with JIS C6481 to obtain the post-HAST peel strength (kgf/cm). When the post-HAST peel strength was more than 0.35 kgf/cm, this was evaluated with the symbol "○"; when this was 0.35 kgf/cm or less, this was evaluated with the symbol "X".

Test Example 4: Evaluation of Plating Adhesion Property (1) Surface Preparation of the Inner Layer Circuit Substrate A glass cloth substrate epoxy resin double-side copper-clad laminate ("R1515A": manufactured by Panasonic Corp.; copper foil's thickness of 18 μm; substrate's thickness of 0.4 mm) formed with an inner layer circuit was etched by 1 μm on both sides thereof by means of CZ8101 (manufactured by MEC Co., Ltd.) so as to roughen the copper surface thereof.

(2) Lamination of the Resin Sheet Attached with Support

A protection film was removed from the Resin Sheet B prepared in Preparation Example 2; and then, this sheet was laminated on both sides of the inner layer circuit substrate by means of a batch type vacuum pressure laminator ("CVP700": two stage build up laminator; manufactured by Nikko-Materials Co., Ltd.). After the pressure was reduced for 30 seconds to 13 hPa or less, the lamination was carried out by press-adhering thereof at 130° C. with the pressure of 0.74 MPa for 45 seconds. Then, this was hot-pressed at 120° C. with the pressure of 0.5 MPa for 75 seconds.

(3) Curing of the Resin Composition

The resin composition layer thus laminated was cured under the condition of 130° C. for 30 minutes, followed by 170° C. for 30 minutes to form an insulating layer.

(4) Formation of Via Hole

A laser beam was irradiated to the insulating layer by means of a $CO_2$ laser processing instrument ("605GTWIII (-P)": manufactured by Mitsubishi Electric Corp.) to form a plurality of via holes having a top diameter of about 30 μm in the insulating layer. The irradiation condition of the laser beam was as follows: mask diameter of 1 mm; pulse width of 16 μs; energy of 0.2 mJ/shot; shot number of 2; and burst mode (10 kHz).

(5) Roughening Treatment

The inner layer circuit substrate formed with the insulating layer was soaked in a swelling liquid containing diethylene glycol monobutyl ether ("Swelling Dip Securiganth P": manufactured by Atotech Japan Co., Ltd.; an aqueous solution of diethylene glycol ethers and sodium hydroxide) at 60° C. for 10 minutes. Next, this was soaked in a roughening solution ("Concentrate Compact CP": manufactured by Atotech Japan Co., Ltd.; an aqueous solution containing $KMnO_4$: 60 g/L and NaOH: 40 g/L;) at 80° C. for 20 minutes. Finally, this was soaked in a neutralization solution ("Reduction Solution Securiganth P": manufactured by Atotech Japan Co., Ltd.; an aqueous sulfuric acid solution) at 40° C. for 5 minutes; and then, this was dried at 80° C. for 30 minutes. This substrate is designated as "Evaluation Substrate A".

(6) Plating by Semi-Additive Method

The Evaluation Substrate A was soaked in an electroless plating solution containing $PdCl_2$ at 40° C. for 5 minutes, and then, in an electroless copper plating solution at 25° C. for 20 minutes. After an annealing treatment at 150° C. for 30 minutes, an etching resist was formed thereon. After patterning by etching, a copper sulfate electroplating was carried out to form a conductive layer having the thickness of 20 μm. Next, an annealing treatment was carried out at 200° C. for 60 minutes. This substrate is designated as "Evaluation Substrate B".

(7) Measurement of Peel Strength (Adhesion Property) of Plated Conductive Layer

In the conductive layer of the Evaluation Substrate B, a portion of a 10 mm width and a 100 mm length was incised; and then, one edge thereof was peeled off and held by a holding device ("AC-50C-SL": AutoCom tester; manufactured by T.S.E Co. Ltd.) to peel off toward a vertical direction at the rate of 50 mm/minute at room temperature. The load at the peeling off length of 35 mm was measured to obtain the plate peel strength (kgf/cm).

Test Example 5: Evaluation of Formability of Via Hole Having Small Diameter

After the roughening treatment, the opening of the via hole formed in the insulating layer having thickness of 10 μm in the Roughened Substrate A obtained in the process (4) of Test Example 1 was observed with a scanning electron microscope ("S-4800": manufactured by Hitachi High-Tech Corp.). From the SEM picture thus observed, an arbitrary diameter $2L_{1t}$ of a circular opening of the via hole after the roughening treatment and a diameter $2L_{2t}$ perpendicular to this arbitrary diameter were measured; and a top area $S_t$ thereof was calculated by inserting these values into the calculation formula $S_t=\pi L_{1t} L_{2t}$. The top area $S_t$ was calculated with regard to 5 different via holes arbitrarily selected. The average value of the top areas in the 5 via holes was taken as the average top area $S_{ta}$.

Similarly, an arbitrary diameter $2L_{1b}$ of a circular bottom of the via hole after the roughening treatment and a diameter $2L_{2b}$ perpendicular to this arbitrary diameter were measured; and a bottom area $S_b$ thereof was calculated by inserting these values into the calculation formula $S_b=\pi L_{1b} L_{2b}$ With regard to the bottom area $S_b$, too, the calculation was made with regard to 5 different via holes arbitrarily selected. The average value of the bottom areas $S_b$ in the 5 via holes was taken as the average bottom area $S_{ba}$.

From the average top area $S_{ta}$ and the average bottom area $S_{ba}$ thus obtained, the average area ratio (a ratio of the average top area $S_{ta}$ and the average bottom area $S_{ba}$, "$S_{ba}/S_{ta}$") was calculated. When this average area ratio $S_{ba}/S_{ta}$ was 60% or more, this was judged with the symbol "○", when the average area ratio $S_{ba}/S_{ta}$ was 50% or more and less than 60%, this was judged with the symbol "Δ", and when the average area ratio $S_{ba}/S_{ta}$ was less than 50%, this was judged with the symbol "X".

The use amount of non-volatile components in the resin composition in Examples and Comparative Examples, measurement results of Test Examples, evaluation results, and so forth are summarized in Table 1 below.

TABLE 1

| | | | | Example | | | | | | |
|---|---|---|---|---|---|---|---|---|---|---|
| | | | | 1 | 2 | 3 | 4 | 5 | 6 | 7 |
| Non-volatile components | (A) Epoxy resin | Liquid epoxy resin | 828US | 10 | 10 | 10 | 10 | 10 | 10 | 10 |
| | | | HP-4032SS | 10 | 10 | 10 | 10 | 10 | 10 | 10 |
| | | Solid epoxy resin | NC3000L | 20 | 20 | 20 | 20 | 20 | 20 | 20 |
| | | | YX4000H | 20 | 20 | 20 | 20 | 20 | 20 | 20 |

TABLE 1-continued

| (part by mass) | (B) | Inorganic filler | 22 m²/g Spherical silica | UFP20 | 300 | 300 | 110 | 300 | 300 | 300 | 300 |
|---|---|---|---|---|---|---|---|---|---|---|---|
| | | | 5.9 m²/g Spherical silica | SC2050-SXF | | | | | | | |
| | (C) | Particulate or non-particulate elastomer | 0.07 to 0.1 μm Rubber particle | MM-101SM | 8.5 | | 8.5 | | | | |
| | | | Liquid polybutadiene epoxy group | JP-100 | | 8.5 | | | | | 8.5 |
| | | | Liquid polybutadiene having phenolic hydroxy group | Synthesis Example 1 | | | | 8.5 | | 40 | |
| | | | | Synthesis Example 2 | | | | | 8.5 | | |
| | | | 1 μm Rubber particle | MM-110SM | | | | | | | |
| | (D) | Curing agent | Active ester type curing agent | HPC-8000-65T | 45.5 | 45.5 | 45.5 | 45.5 | 45.5 | 45.5 | |
| | | | | HPC-8150-60T | | | | | | | 45.5 |
| | | | Phenol type curing agent | LA-3018-50P | 3 | 3 | 3 | 3 | 3 | 3 | 3 |
| | | | Carbodiimide type curing agent | V-03 | 9 | 9 | 9 | 9 | 9 | 9 | 9 |
| | (E) | Curing accelerator | Amine type curing accelerator | DMAP | 0.3 | 0.3 | 0.3 | 0.3 | 0.3 | 0.3 | 0.3 |
| | (F) | Flame retardant | Phosphate ester | PX-200 | 3 | 3 | 3 | 3 | 3 | 3 | 3 |
| | (G) | Thermoplastic resin | Phenoxy resin | YX7553BH30 | 3 | 3 | 3 | 3 | 3 | 3 | 3 |
| Total of non-volatile components | | | | | 432.3 | 432.3 | 242.3 | 432.3 | 432.3 | 483.8 | 432.3 |
| Total of non-volatile components except for inorganic filler | | | | | 132.3 | 132.3 | 132.3 | 132.3 | 132.3 | 163.8 | 132.3 |
| In resin composition | | Content of (B) component (% by mass) | | | 69.4 | 69.4 | 45.4 | 69.4 | 69.4 | 64.7 | 69.4 |
| In resin composition (except for (B) component) | | Content of (A) component (% by mass) | | | 45.4 | 45.4 | 45.4 | 45.4 | 45.4 | 36.6 | 45.4 |
| | | Content of (C) component (% by mass) | | | 6.4 | 6.4 | 6.4 | 6.4 | 6.4 | 24.4 | 6.4 |
| | | Content of (D) component (% by mass) | | | 43.5 | 43.5 | 43.5 | 43.5 | 43.5 | 35.1 | 43.5 |
| | | Content of (E) component (% by mass) | | | 0.2 | 0.2 | 0.2 | 0.2 | 0.2 | 0.2 | 0.2 |
| | | Content of (F) component (% by mass) | | | 2.3 | 2.3 | 2.3 | 2.3 | 2.3 | 1.8 | 2.3 |
| | | Content of (G) component (% by mass) | | | 2.3 | 2.3 | 2.3 | 2.3 | 2.3 | 1.8 | 2.3 |
| Characteristics | Suppression of warp | Degree of generated warp | | | ○ | ○ | ○ | ○ | ○ | ○ | ○ |
| | Plating adhesion property | Plating peel strength (kgf/cm) | | | 0.49 | 0.46 | 0.49 | 0.48 | 0.47 | 0.49 | 0.46 |
| | Insulation reliability | Thickness of Insulating layer (μm) | | | 4.8 | 4.8 | 4.9 | 4.7 | 4.7 | 4.8 | 4.8 |
| | | Minimum resistance (Ω) | | | $9.55 \times 10^{11}$ | $8.45 \times 10^{11}$ | $7.85 \times 10^{11}$ | $9.60 \times 10^{10}$ | $8.50 \times 10^{10}$ | $9.60 \times 10^{11}$ | $6.85 \times 10^{11}$ |
| | | Judgement | | | ○ | ○ | ○ | ○ | ○ | ○ | ○ |
| | Copper foil adhesion property | Pre-HAST copper foil peel strength (kgf/cm) | | | 0.65 | 0.63 | 0.68 | 0.67 | 0.69 | 0.66 | 0.64 |
| | | Post-HAST copper foil peel strength (kgf/cm) | | | 0.41 | 0.37 | 0.42 | 0.42 | 0.42 | 0.4 | 0.38 |
| | | Judgement | | | ○ | ○ | ○ | ○ | ○ | ○ | ○ |
| | Formability of small diameter via hole | Average top area $S_{ta}$ (μm²) | | | 2600 | 2500 | 2550 | 2500 | 2500 | 2700 | 2400 |
| | | Average bottom area $S_{ba}$ (μm²) | | | 1650 | 1550 | 1750 | 1600 | 1550 | 1650 | 1550 |
| | | Average area ratio $S_{ba}/S_{ta}$ (%) | | | 63 | 62 | 69 | 64 | 62 | 61 | 65 |
| | | Judgement | | | ○ | ○ | ○ | ○ | ○ | ○ | ○ |

| | | | | | Comparative Example | | | | |
|---|---|---|---|---|---|---|---|---|---|
| | | | | | 1 | 2 | 3 | 4 | 5 |
| Non-volatile components (part by mass) | (A) | Epoxy resin | Liquid epoxy resin | 828US | 10 | 10 | 10 | 10 | 10 |
| | | | | HP-4032SS | 10 | 10 | 10 | 10 | 10 |
| | | | Solid epoxy resin | NC3000L | 20 | 20 | 20 | 20 | 20 |
| | | | | YX4000H | 20 | 20 | 20 | 20 | 20 |
| | (B) | Inorganic filler | 22 m²/g Spherical silica | UFP20 | | | 300 | 300 | 300 |
| | | | 5.9 m²/g Spherical silica | SC2050-SXF | 300 | 300 | | | |

TABLE 1-continued

| | | | | | | | | |
|---|---|---|---|---|---|---|---|---|
| (C) Particulate or non-particulate elastomer | | 0.07 to 0.1 μm Rubber particle | MM-101SM | | 8.5 | | | |
| | | Liquid polybutadiene epoxy group | JP-100 | | | | | |
| | | Liquid polybutadiene having phenolic hydroxy group | Synthesis Example 1 Synthesis Example 2 | | | | | 80 |
| | | 1 μm Rubber particle | MM-110SM | 8.5 | | 8.5 | | |
| (D) Curing agent | | Active ester type curing agent | HPC-8000-65T | 45.5 | 45.5 | 45.5 | 45.5 | 45.5 |
| | | | HPC-8150-60T | | | | | |
| | | Phenol type curing agent | LA-3018-50P | 3 | 3 | 3 | 3 | 3 |
| | | Carbodiimide type curing agent | V-03 | 9 | 9 | 9 | 9 | 9 |
| (E) Curing accelerator | | Amine type curing accelerator | DMAP | 0.3 | 0.3 | 0.3 | 0.3 | 0.3 |
| (F) Flame retardant | | Phosphate ester | PX-200 | 3 | 3 | 3 | 3 | 3 |
| (G) Thermoplastic resin | | Phenoxy resin | YX7553BH30 | 3 | 3 | 3 | 3 | 3 |
| Total of non-volatile components | | | | 432.3 | 432.3 | 432.3 | 423.8 | 503.8 |
| Total of non-volatile components except for inorganic filler | | | | 132.3 | 132.3 | 132.3 | 123.8 | 203.8 |
| In resin composition | Content of (B) component (% by mass) | | | 69.4 | 69.4 | 69.4 | 70.8 | 59.5 |
| In resin composition (except for (B) component) | Content of (A) component (% by mass) | | | 45.4 | 45.4 | 45.4 | 48.5 | 29.4 |
| | Content of (C) component (% by mass) | | | 6.4 | 6.4 | 6.4 | | 39.3 |
| | Content of (D) component (% by mass) | | | 43.5 | 43.5 | 43.5 | 46.4 | 28.2 |
| | Content of (E) component (% by mass) | | | 0.2 | 0.2 | 0.2 | 0.2 | 0.1 |
| | Content of (F) component (% by mass) | | | 2.3 | 2.3 | 2.3 | 2.4 | 1.5 |
| | Content of (G) component (% by mass) | | | 2.3 | 2.3 | 2.3 | 2.4 | 1.5 |
| Characteristics | Suppression of warp | Degree of generated warp | | x | x | x | x | ○ |
| | Plating adhesion property | Plating peel strength (kgf/cm) | | 0.48 | 0.47 | 0.48 | 0.42 | 0.47 |
| | Insulation reliability | Thickness of Insulating layer (μm) | | 4.7 | 4.9 | 4.7 | 4.7 | 4.8 |
| | | Minimum resistance (Ω) | | $4.65 \times 10^3$ | $2.46 \times 10^4$ | $8.10 \times 10^3$ | $2.10 \times 10^{11}$ | $2.05 \times 10^4$ |
| | | Judgement | | x | x | x | ○ | x |
| | Copper foil adhesion property | Pre-HAST copper foil peel strength (kgf/cm) | | 0.55 | 0.53 | 0.58 | 0.53 | 0.5 |
| | | Post-HAST copper foil peel strength (kgf/cm) | | 0.33 | 0.31 | 0.34 | 0.32 | 0.31 |
| | | Judgement | | x | x | x | x | x |
| | Formability of small diameter via hole | Average top area $S_{ta}$ (μm$^2$) | | 2850 | 2650 | 3000 | 2500 | 3050 |
| | | Average bottom area $S_{ba}$ (μm$^2$) | | 1350 | 1300 | 1350 | 1550 | 1500 |
| | | Average area ratio $S_{ba}/S_{ta}$ (%) | | 47 | 49 | 45 | 62 | 49 |
| | | Judgement | | x | x | x | ○ | x |

It was found that when the resin composition including (A) the epoxy resin, (B) the inorganic filler, and (C) the particulate or the non-particulate elastomer, in which a specific surface area of the (B) component was 10 m$^2$/g or more, a content of the (C) component was 35% by mass or less, and an average particle diameter of the (C) component was 0.8 μm or less was used, a warp in a cured product thereof could be suppressed, and in addition, superior insulation reliability, adhesion property, and formability of a via hole having a small diameter could be accomplished.

What is claimed is:

1. A resin composition, comprising:
(A) at least one epoxy resin which comprises at least one selected from a bisphenol A epoxy resin, a naphthalene epoxy resin, and a biphenyl epoxy resin;
(B) at least one silica;
(C) at least one particulate elastomer, which comprises at least one selected from the group consisting of a styrene-butadiene rubber particle, an isoprene rubber particle, a butadiene rubber particle, a chloroprene rubber particle, an acrylonitrile-butadiene rubber particle, a butyl rubber particle, an ethylene-propylene rubber particle, an urethane rubber particle, a silicone rubber particle, a chlorosulfonated polyethylene rubber particle, a chlorinated polyethylene rubber particle, an acryl rubber particle, an epichlorohydrin rubber particle, a polysulfide rubber particle, a fluorine-containing rubber particle, and mixtures thereof; and (D) at least one curing agent which comprises at least one selected from an active ester curing agent, a phenol curing agent, and a carbodiimide curing agent, wherein a content of said (A) at least one epoxy resin is 35% by mass or more based on 100% by mass of non-volatile components except for said (B) at least one silica in said resin composition, a specific surface area of said (B) at least one silica is 18 $m^2/g$ or more and 50 $m^2/g$ or less, a content of said (B) at least one silica is 40% by mass or more and 80% by mass or less based on 100% by mass of non-volatile components in the resin composition, said (B) at least one silica is surface-modified with at least one silane coupling agent, a content of said (C) at least one particulate elastomer is 1% by mass or more and 35% by mass or less based on 100% by mass of non-volatile components except for said (B) at least one silica in said resin composition, an average particle diameter of said particulate elastomer is 0.01 μm or more and 0.2 μm or less, and a content of said (D) at least one curing agent is 30% by mass or more based on 100% by mass of non-volatile components except for said (B) at least one silica in said resin composition.

2. The resin composition according to claim 1, wherein a specific surface area of said (B) at least one silica is 20 $m^2/g$ or more and 50 $m^2/g$ or less.

3. The resin composition according to claim 1, wherein said particulate elastomer comprises at least one selected from the group consisting of an isoprene rubber particle, a butadiene rubber particle, a chloroprene rubber particle, a butyl rubber particle, an ethylene-propylene rubber particle, an urethane rubber particle, a silicone rubber particle, a chlorosulfonated polyethylene rubber particle, a chlorinated polyethylene rubber particle, an epichlorohydrin rubber particle, a polysulfide rubber particle, a fluorine-containing rubber particle, and mixtures thereof.

4. The resin composition according to claim 1, wherein said (D) at least one curing agent comprises the active ester curing agent.

5. A cured product of the resin composition according to claim 1.

6. A sheet laminate material, comprising the resin composition according to claim 1.

7. A resin sheet comprising:
(a) a support; and
(b) a layer of the resin composition according to claim 1 formed on said support.

8. A printed wiring board, comprising an insulating layer formed of a cured product of the resin composition according to claim 1.

9. A semiconductor device, comprising the printed wiring board according to claim 8.

10. The resin composition according to claim 1, wherein said (D) at least one curing agent comprises the carbodiimide curing agent.

11. The resin composition according to claim 1, wherein said (C) at least one particulate elastomer exhibits an elastic modulus of 1 GPa or less upon executing an elongation test in accordance with Japanese Industry Standard JIS K7161 at 25° C. and the humidity of 40% RH.

12. The resin composition according to claim 1, wherein the average particle diameter of said particulate elastomer is 0.05 μm or more and 0.2 μm or less.

* * * * *